US010347653B2

(12) United States Patent
Lee et al.

(10) Patent No.: US 10,347,653 B2
(45) Date of Patent: Jul. 9, 2019

(54) 3D SEMICONDUCTOR MEMORY DEVICE

(71) Applicant: SK hynix Inc., Icheon-si, Gyeonggi-do (KR)

(72) Inventors: Ki Hong Lee, Suwon-si Gyeonggi-do (KR); Seung Ho Pyi, Seongnam-si Gyeonggi-do (KR); Seok Min Jeon, Yeoju-gun Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/953,092

(22) Filed: Apr. 13, 2018

(65) Prior Publication Data

US 2018/0240813 A1 Aug. 23, 2018

Related U.S. Application Data

(60) Continuation of application No. 15/283,961, filed on Oct. 3, 2016, which is a continuation-in-part of application No. 14/474,383, filed on Sep. 2, 2014, now Pat. No. 9,576,970, which is a division of application No. 13/601,396, filed on Aug. 31, 2012, now Pat. No. 8,853,767.

(30) Foreign Application Priority Data

Jun. 4, 2012 (KR) .................. 10-2012-0059920

(51) Int. Cl.
H01L 27/11565 (2017.01)
H01L 27/11582 (2017.01)
H01L 27/1157 (2017.01)

(52) U.S. Cl.
CPC .... *H01L 27/11582* (2013.01); *H01L 27/1157* (2013.01); *H01L 27/11565* (2013.01)

(58) Field of Classification Search
CPC ........ H01L 27/11519; H01L 27/11551–11556; H01L 27/11565; H01L 27/11578–11582
See application file for complete search history.

(56) References Cited

U.S. PATENT DOCUMENTS

| 8,008,710 B2 | 8/2011 | Fukuzumi et al. |
| 8,076,198 B2 | 12/2011 | Lee et al. |
| 8,178,919 B2 | 5/2012 | Fujiwara et al. |
| 2010/0059811 A1 | 3/2010 | Sekine et al. |
| 2010/0237400 A1 | 9/2010 | Aoyama |
| 2010/0244119 A1 | 9/2010 | Fukuzumi et al. |
| 2011/0291176 A1 | 12/2011 | Lee et al. |
| 2012/0003831 A1 | 1/2012 | Kang et al. |
| 2012/0043673 A1 | 2/2012 | Chang et al. |
| 2012/0049267 A1 | 3/2012 | Jung |
| 2012/0170368 A1 | 7/2012 | Lee et al. |

(Continued)

FOREIGN PATENT DOCUMENTS

KR 1020140062636 A 5/2014

*Primary Examiner* — Zandra V Smith
*Assistant Examiner* — Molly K Reida
(74) *Attorney, Agent, or Firm* — Williams Park Associates LTD.

(57) ABSTRACT

Provided herein a semiconductor device including a stack including conductive layers and insulating layers that are alternately stacked, and a slit insulating layer passing through the stack in a stacking direction, the slit 5 insulating layer including a first main pattern extending in a first direction, and a first protruding pattern protruding in a second direction crossing the first direction at an end of the first main pattern.

19 Claims, 31 Drawing Sheets

(56) References Cited

U.S. PATENT DOCUMENTS

| | | |
|---|---|---|
| 2012/0273865 A1 | 11/2012 | Lee et al. |
| 2013/0009235 A1 | 1/2013 | Yoo |
| 2014/0015057 A1 | 1/2014 | Lee et al. |
| 2014/0131783 A1 | 5/2014 | Lee et al. |

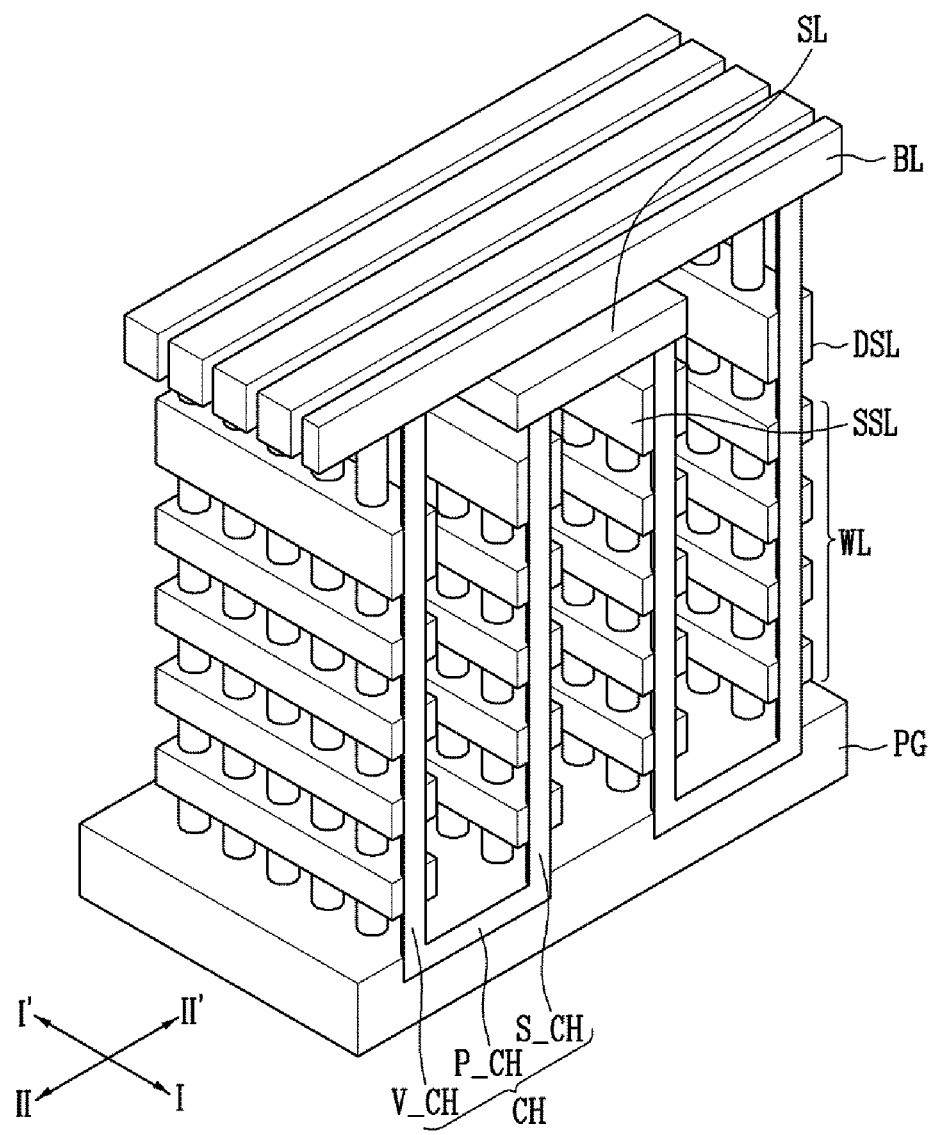

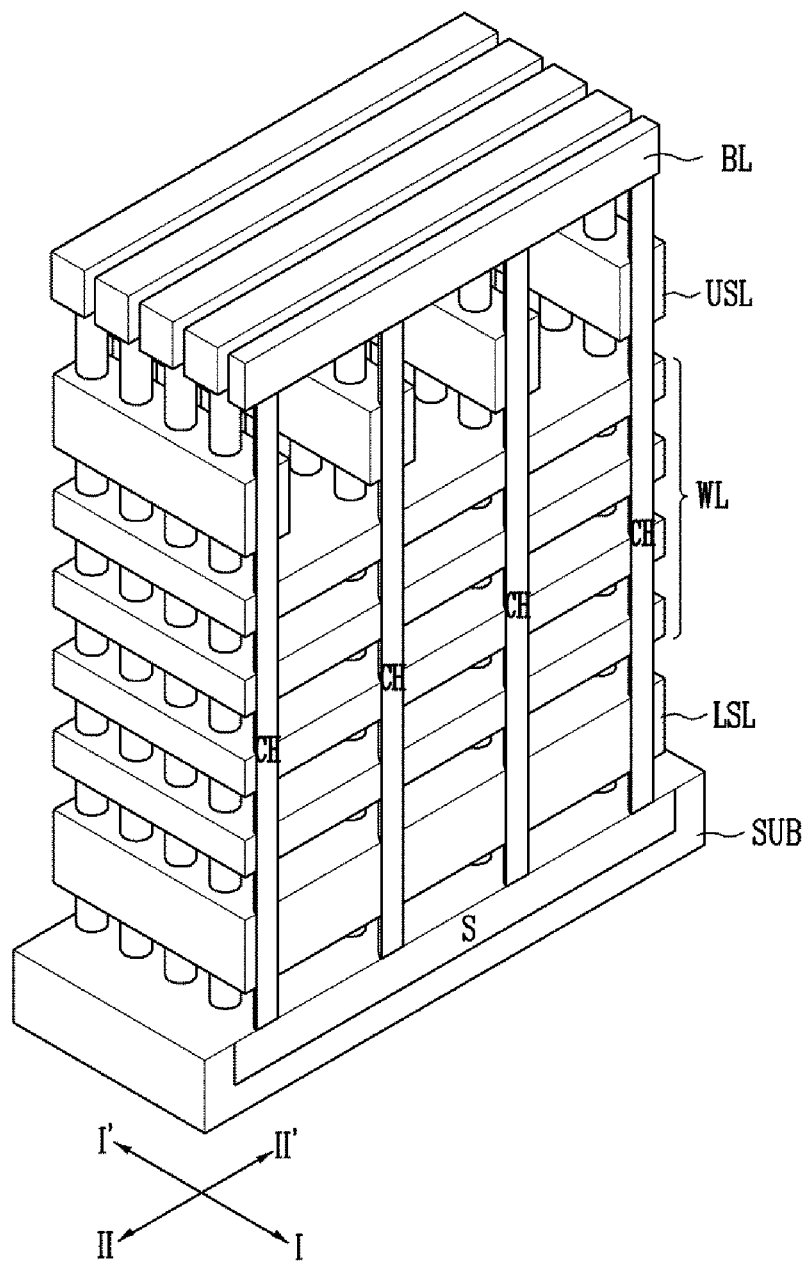

A-A'

A-A'

A-A'

A-A'

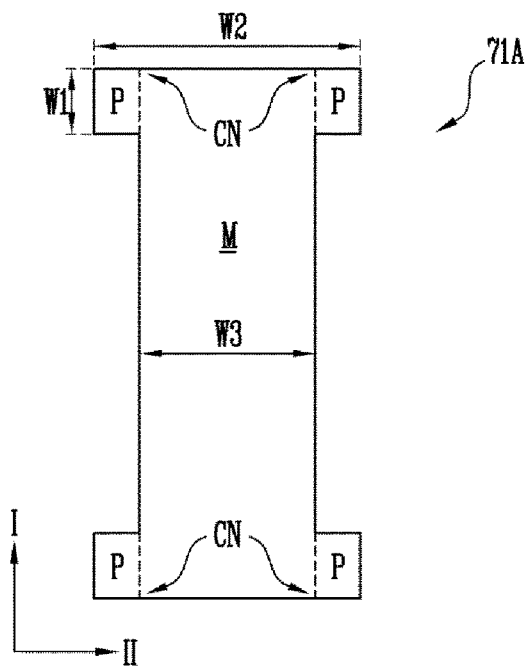
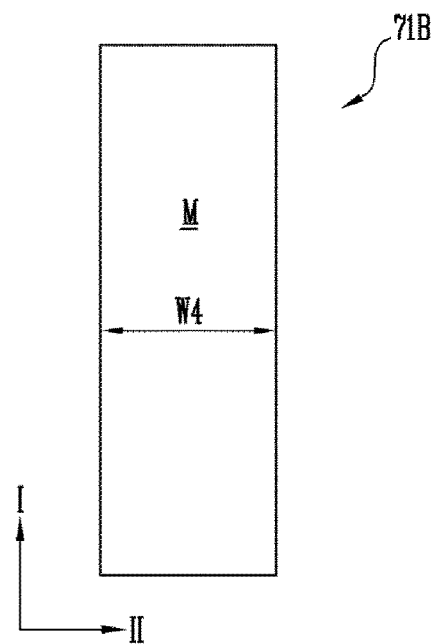

3D SEMICONDUCTOR MEMORY DEVICE

CROSS-REFERENCE TO RELATED APPLICATION

This application is a continuation application of the prior application Ser. No. 15/283,961, filed on Oct. 3, 2016, which is a continuation-in-part application of the prior application Ser. No. 14/474,383, filed Sep. 2, 2014, which is a divisional application of the prior application Ser. No. 13/601,396 filed on Aug. 31, 2012, which claims priority to Korean patent application number 10-2012-0059920 filed on Jun. 4, 2012, in the Korean Intellectual Property Office, the entire disclosure of which is incorporated by reference herein.

BACKGROUND

1. Technical Field

Various embodiments relate generally to a semiconductor device and a method of manufacturing the same, and to a three-dimensional semiconductor device having a source layer and a method of manufacturing the same.

2. Related Art

A non-volatile memory device can retain data stored therein even in the absence of a power supply. As the degree of integration in creating two-dimensional memory devices that have memory cells fabricated in the form of a single layer on silicon substrates reaches a limit, suggestions of three-dimensional structured non-volatile memory devices that have memory cells vertically stacked on silicon substrates are proposed.

The structure of a known three-dimensional (3-D) non-volatile memory device is described below with reference to FIGS. 1A and 1B.

FIG. 1A is a perspective view of the structure of a conventional 3-D non-volatile memory device. FIG. 1B is a circuit diagram of a single string.

As illustrated in FIG. 1A, the conventional 3-D non-volatile memory device has a plurality of U-shaped channel layers CH each of which comprises a pipe channel layer P_CH formed in a pipe gate PG and first and second vertical channel layers V_CH coupled to the pipe channel layer P_CH. In addition, the conventional 3-D non-volatile memory device may further include word lines WL stacked one upon another and surrounding the first and second vertical channel layers V_CH, source select lines SSL and drain select lines DSL stacked over the word lines WL, a source line SL and bit lines BL.

As illustrated in FIG. 1B, a drain select transistor DST, memory cells MC, a pipe transistor P_Tr and a source select transistor SST form a single string. The string has a U shape. In the related art, since the string has a U shape, the pipe transistor P_Tr is essentially provided to couple source side memory cells MC stacked along the first vertical channel layers V_CH and drain side memory cells MC stacked along the second vertical channel layers V_CH to each other.

However, in addition to the processes of forming memory cells, another process of forming pipe transistors is also needed, thus increasing the number of processes. In addition, it may be difficult to control threshold voltages of these pipe transistors.

FIG. 2A is a perspective view of the structure of a conventional 3-D non-volatile memory device. FIG. 2B is a circuit diagram of a single string.

As illustrated in FIG. 2A, the conventional 3-D non-volatile memory device includes a lower select line LSL, word lines WL, and upper select lines USL that are stacked sequentially over a substrate SUB that includes a source region S. In addition, the conventional 3-D non-volatile memory device may further include vertical channel layers CH, memory layers (not illustrated) and bit lines BL. The vertical channel layers CH may pass through the lower select line LSL, the word lines WL, and the upper select lines USL. The memory layers may surround sidewalls of the vertical channel layers CH. The bit lines BL may be coupled to top surfaces of the vertical channel layers CH.

As illustrated in FIG. 2B, the lower select transistor LST, the memory cells MC, and the upper select transistor UST form a single string. The string may extend vertically.

However, as far as conventional 3-D non-volatile memory devices are concerned, it is not easy to perform the processes associated with the manufacturing of memory layers and vertical channel layers. Specifically, as for a known memory device, after channel holes are formed such that they pass through interlayer insulating layers and conductive layers stacked alternately, a memory layer is formed along inner surfaces of the channel holes. Subsequently, the memory layer formed on the bottom surfaces of the channel holes may be removed to expose the source region S, and the vertical channel layers CH are formed. However, it is difficult to perform the process of etching the memory layer on the bottom surfaces of the channel holes with high aspect ratios. In addition, damage to the memory layer formed along inner walls of the channel holes may occur during the etch process, thus deteriorating characteristics of the memory cells.

BRIEF SUMMARY

An embodiment relates to a semiconductor device that does not have a pipe transistor and allows for easy manufacture, and a method of manufacturing the same.

One embodiment of the present disclosure provides a semiconductor device including: a stack including conductive layers and insulating layers that are alternately stacked; and a slit insulating layer passing through the stack in a stacking direction, the slit insulating layer comprising a first main pattern extending in a first direction and a first protruding pattern protruding in a second direction crossing the first direction at an end of the first main pattern.

Another embodiment of the present disclosure provides a semiconductor device including: a source structure; conductive layers stacked on the source structure; channel layers passing through the conductive layers and coupled to the source structure; and a slit insulating layer passing through the conductive layers in a stacking direction and including an upper surface having a shape in which an end thereof is extended in width, and a lower surface having a uniform width.

BRIEF DESCRIPTION OF THE DRAWINGS

FIGS. 1A and 1B are views of the structure of a conventional three-dimensional (3-D) non-volatile memory device;

FIGS. 2A and 2B are views of the structure of a conventional (3-D) non-volatile memory device;

FIGS. 17A to 17E are views illustrating the structure of a slit insulating layer according to an embodiment;

DETAILED DESCRIPTION

Hereinafter, various embodiments of the present disclosure will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1B:
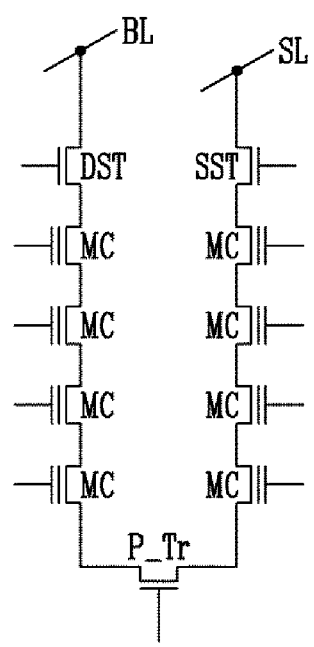
Figure 2B:
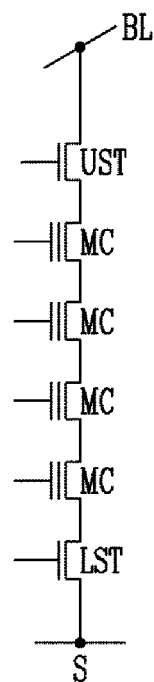
Figure 3:
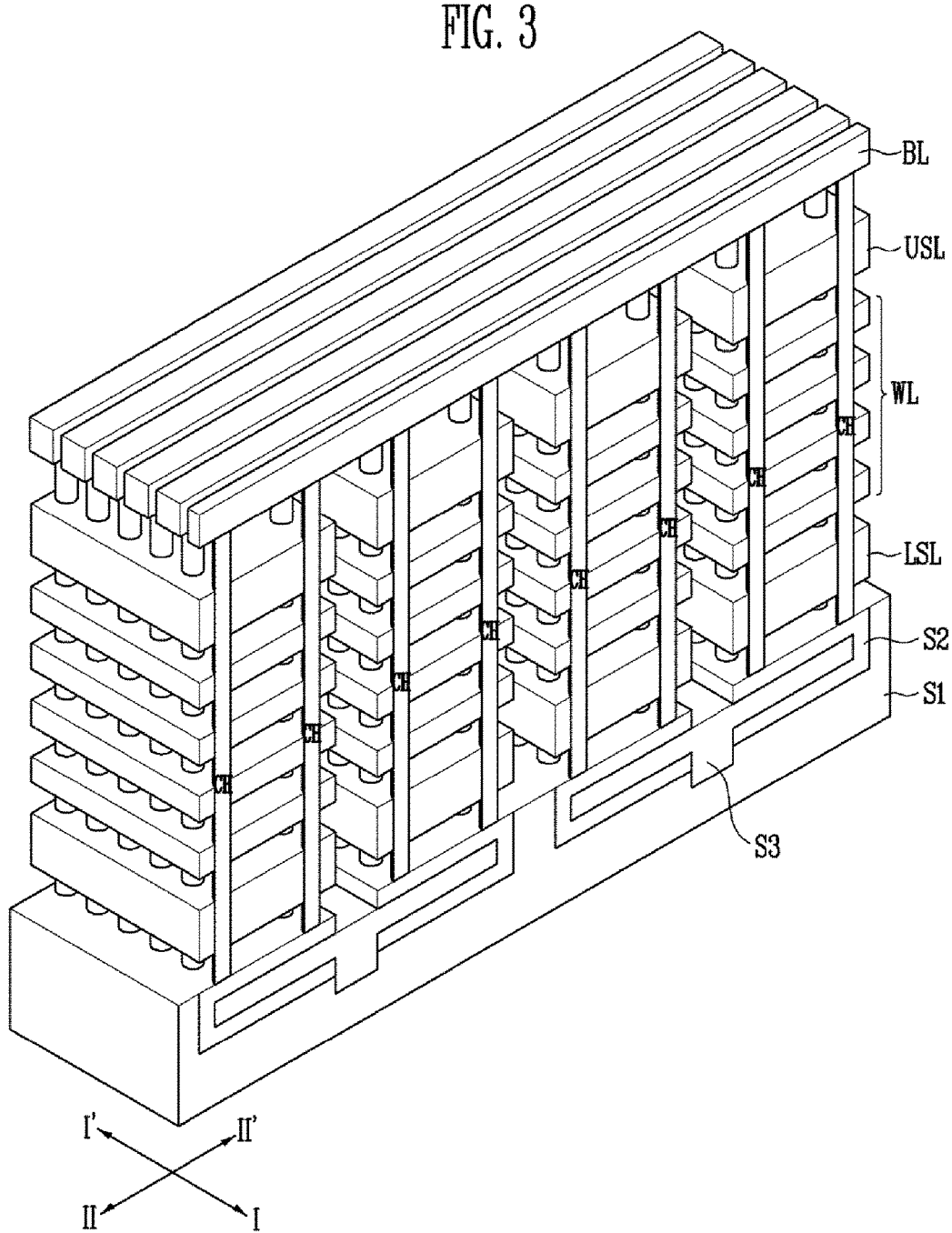
FIG. 3 is a perspective view of the structure of a semiconductor device according to an embodiment.

FIG. 3 is a perspective view of the structure of a semiconductor device according to an embodiment. An insulating layer is not depicted for illustration purposes.

As illustrated in FIG. 3, the semiconductor device according to the embodiment may include a first source layer S1; one or more second source layers S2 formed substantially in the first source layer S1; a plurality of conductive layers formed substantially over the first source layer S1; semiconductor pillars passing through the conductive layers and coupled to the one or more second source layers S2; and a third source layer S3 formed substantially in each second source layer S2, and passing through the second source layer S2 and coupled to the first source layer S1.

In addition, the semiconductor device according to the embodiment may further include memory layers (not illustrated) and bit lines BL. Each of the memory layers may substantially surround outer surfaces of the semiconductor pillars and an outer surface of the second source layer S2. The bit lines BL may be formed substantially over the conductive layers and extend in a second direction Each of the bit lines BL may be coupled to the semiconductor pillars that are arranged in the second direction II-II'.

Here, at least one of lowermost conductive layers, from the plurality of conductive layers stacked one upon another, may be used as a lower select line LSL, at least one of uppermost conductive layers may be used as an upper select line USL, and the rest of the conductive layers may be used as word lines WL.

Each of the first to third source layers S1 to S3 may comprise of a polysilicon layer doped with impurities or a metal layer. For example, the first and second source layers S1 and S2 may be formed of polysilicon layers doped with N-type impurities, and the third source layer S3 may comprise of a metal layer formed of tungsten.

The semiconductor pillars may be used as channel layers CH. For example, each of the semiconductor pillars may be formed of a polysilicon layer not doped with impurities. In addition, the semiconductor pillars may be formed integrally with the second source layer S2.

According to the structure of the semiconductor device as described above, strings substantially extend vertically from a substrate. Therefore, pipe transistors may not be provided, which makes it easier to drive the memory device. In addition, as the third source layer S3 comprises a metal layer, and the third source layer S3 is coupled to the first and second source layers S1 and S2, source resistance may be reduced improving the characteristics of the memory device.

Figure 4:
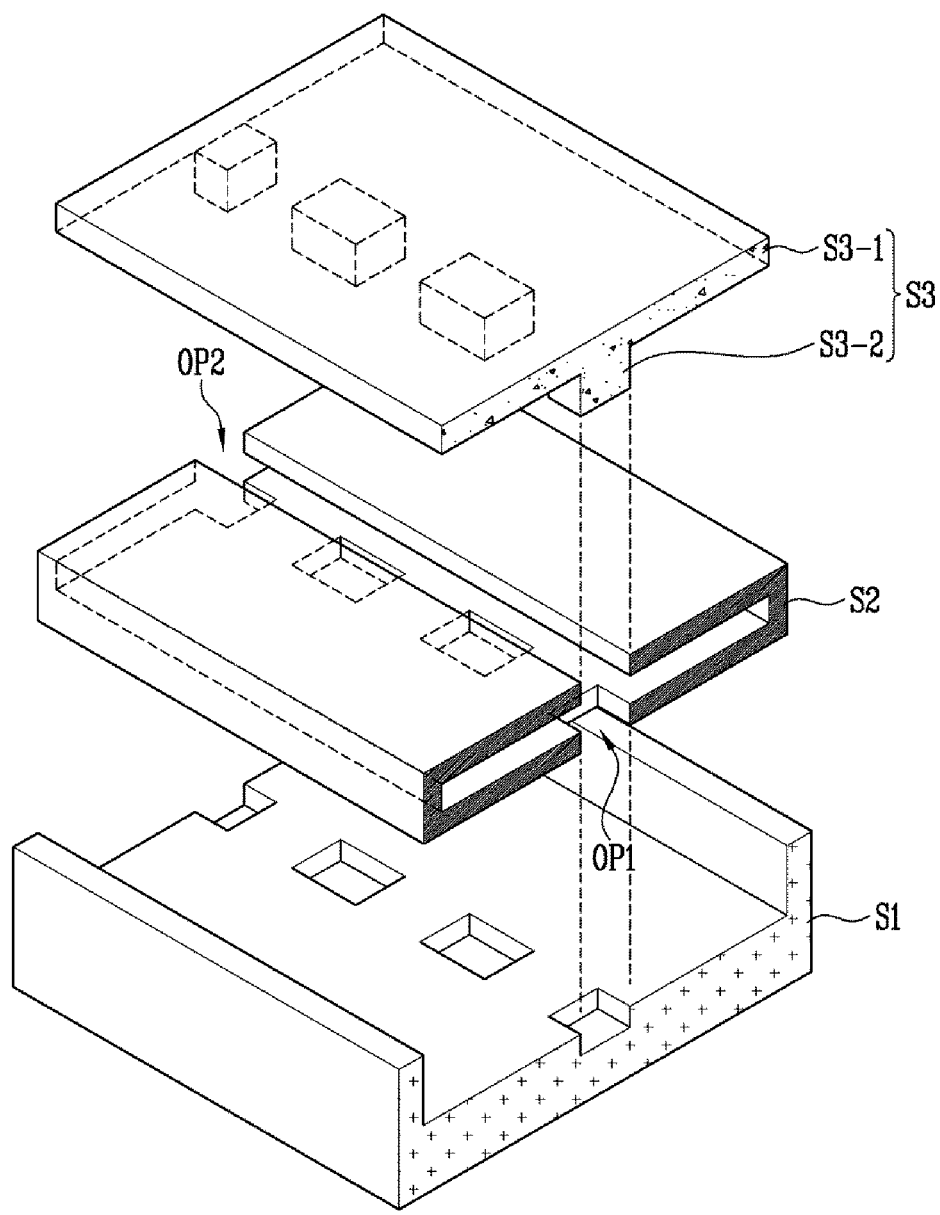
FIGS. 4 and 5 are exploded perspective views of a source layer structure of the semiconductor device according to an embodiment.

FIG. 4 is an exploded perspective view of a source layer structure of the semiconductor device according to an embodiment.

As illustrated in FIG. 4, the second source layer S2 may be formed substantially in the first source layer S1, and the first source layer S1 substantially surrounds the side surfaces and the bottom surface of the second source layer S2. In addition, the third source layer S3 may be formed substantially in the second source layer S2, and the second source layer S2 substantially surrounds a top surface, side surfaces, and the bottom surface of the third source layer S3.

Here, the second source layer S2 may include one or more first openings OP1 that may be formed substantially in the bottom surface thereof and at least one second opening OP2 formed substantially in the top surface thereof. Here, the one or more first openings OP1 may be in the form of islands and may be arranged at regular intervals. The second opening OP2 may be in the form of a line and may overlap with the first openings OP1.

The third source layer S3 may comprise of a plate layer S3-1 and one or more protruding layers S3-2. The plate layer S3-1 may be formed substantially in the second source layer S2. The one or more protruding layers S3-2 may protrude from a bottom surface of the plate layer S3-1. The one or more protruding layers S3-2 may be in the form of islands and be located at positions corresponding to the first openings OP1 of the second source layer S2. Therefore, the protruding layers S3-2 may protrude through the first openings OP1 of the second source layer S2 and be directly coupled to the first source layer S1.

Figure 5:
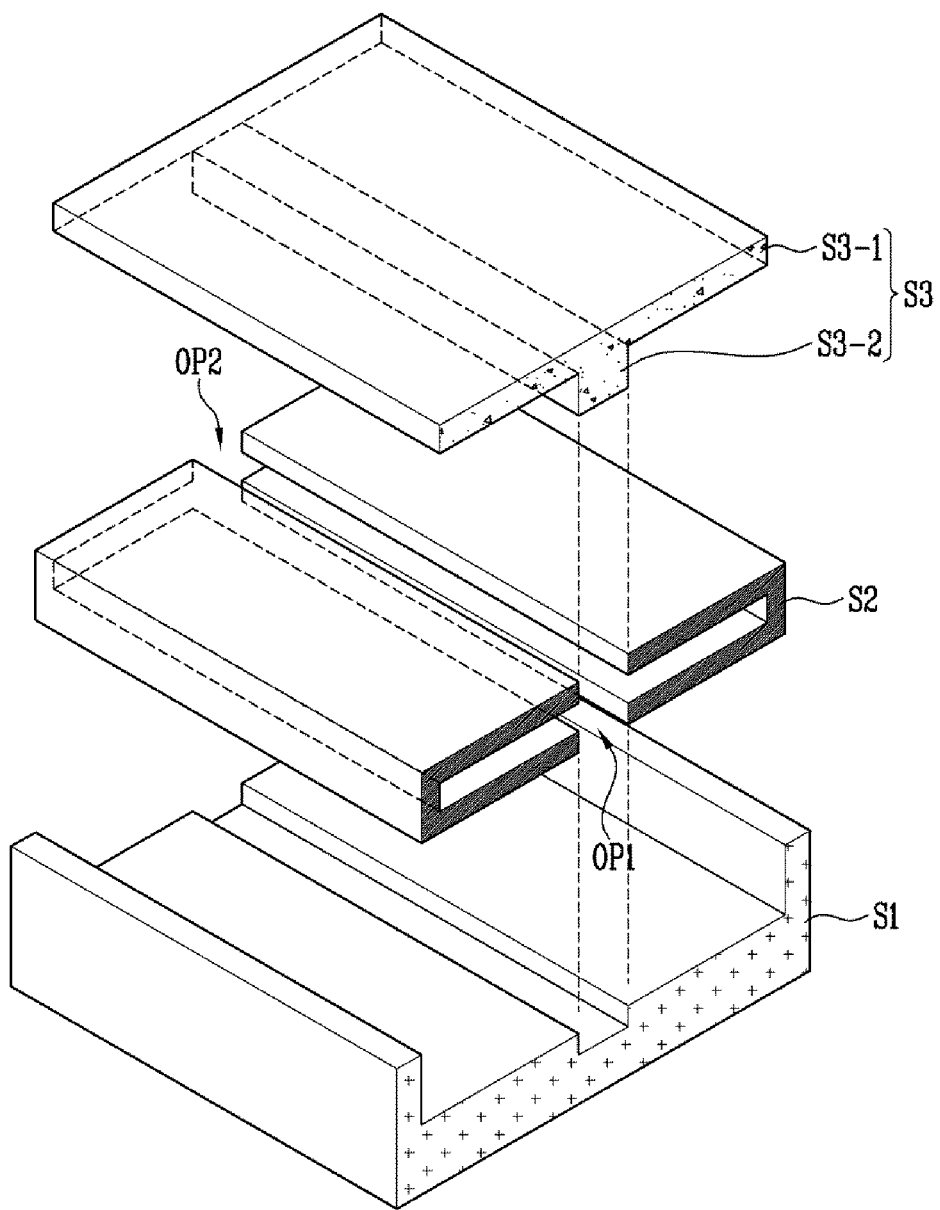

FIG. 5 is an exploded perspective view of a source layer structure of the semiconductor device according to an embodiment.

As illustrated in FIG. 5, the second source layer S2 may be formed substantially in the first source layer S1, and the first source layer S1 substantially surrounds side surfaces and the bottom surface of the second source layer S2. In addition, the third source layer S3 may be formed substantially in the second source layer S2, and the second source layer S2 substantially surrounds a top surface, side surfaces, and a bottom surface of the third source layer S3.

Here, the second source layer S2 may comprise, at least, one first opening OP1 that is formed substantially in the bottom surface thereof and at least one second opening OP2 that may be formed substantially in the top surface thereof. The first opening OP1 may be in the form of a line that substantially crosses the bottom surface of the second source layer S2, and the second opening OP2 may be in the form of a line that substantially crosses the top surface of the second source layer S2. In addition, the first opening OP1 and the second opening OP2 may substantially overlap with each other.

The third source layer S3 may comprise the plate layer S3-1 and at least one protruding layer S3-2. The plate layer S3-1 may be formed substantially in the second source layer S2, and the protruding layer S3-2 may protrude from a bottom surface of the plate layer S3-1. The protruding layer S3-2 may be in the form of a line and may be located at a position corresponding to the first opening OP1 of the second source layer S2. Therefore, the protruding layer S3-2 may protrude through the first opening OP1 of the second source layer S2 and be directly coupled to the first source layer S1.

Figure 8A:
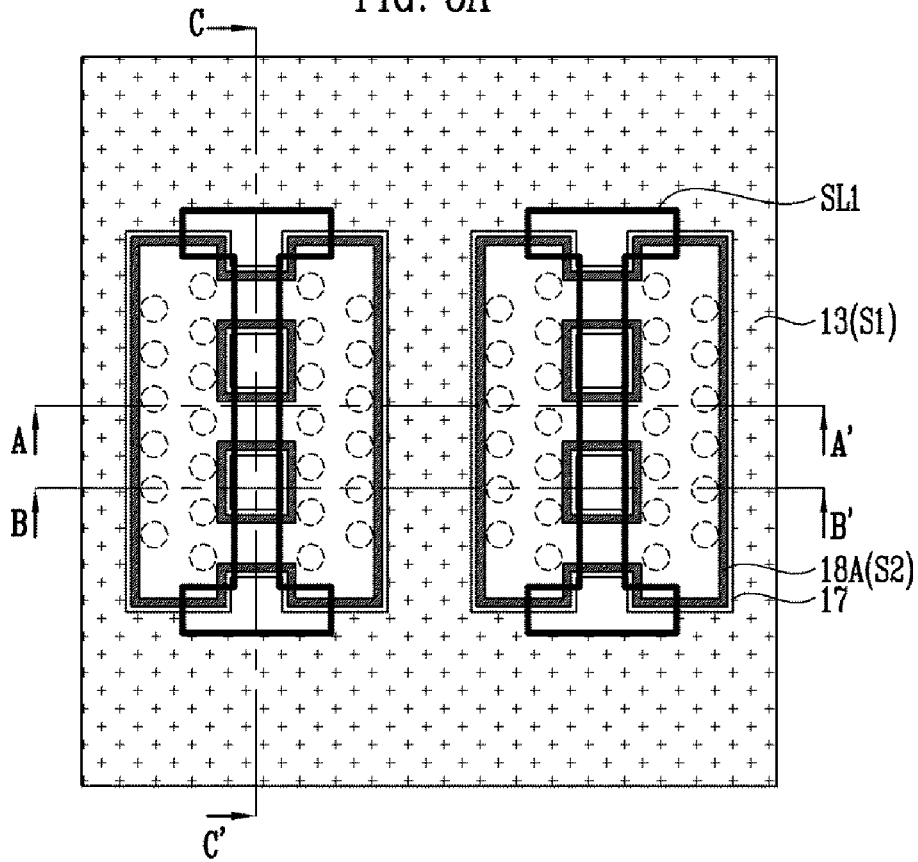
Figure 8B:
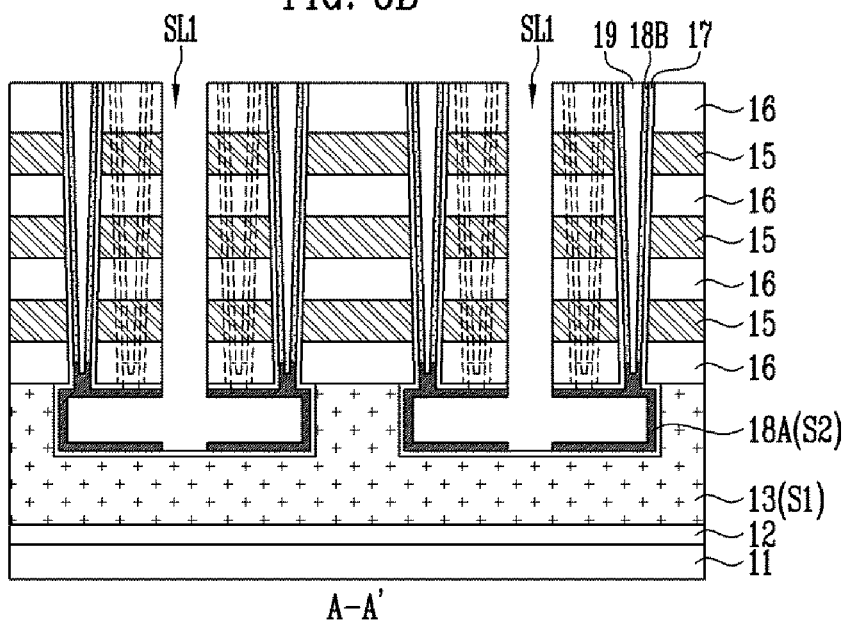
Figure 8C:
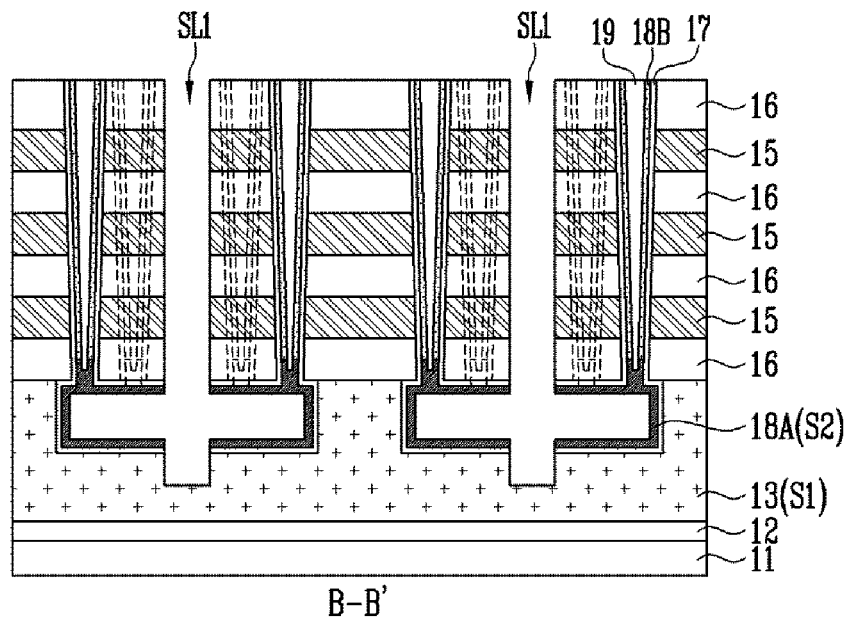
Figure 8D:
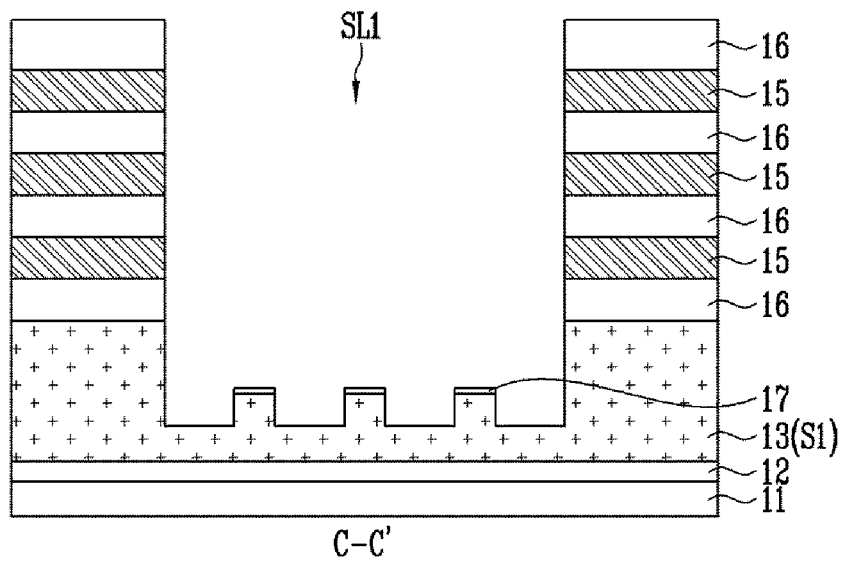
Figure 9A:
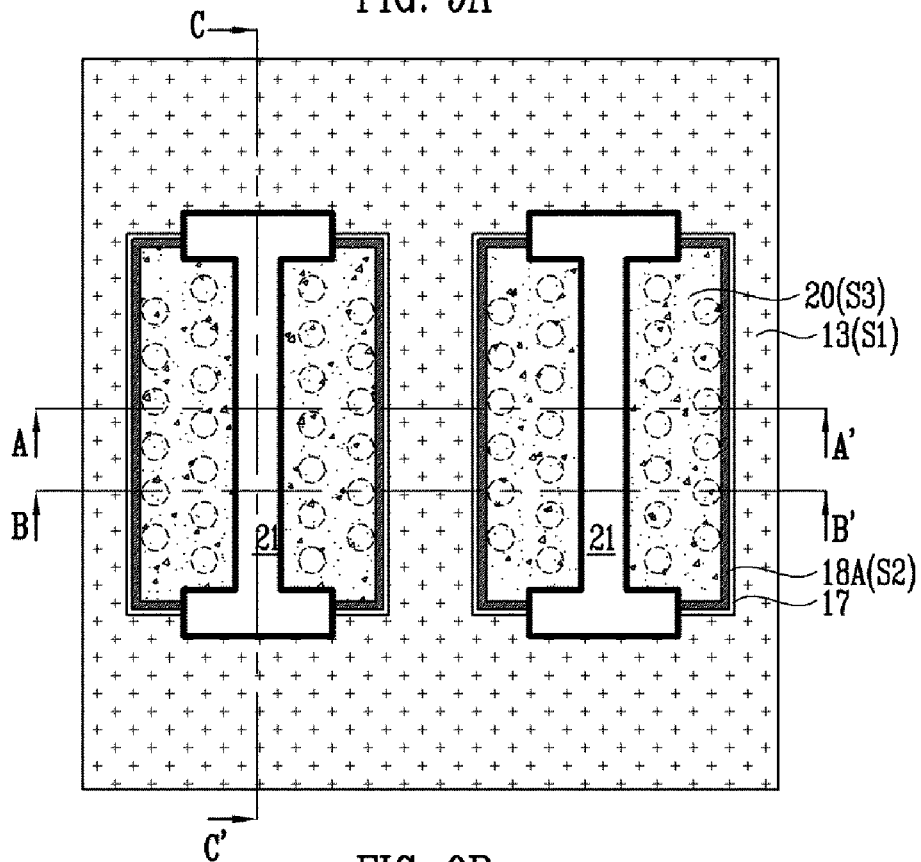
Figure 9B:
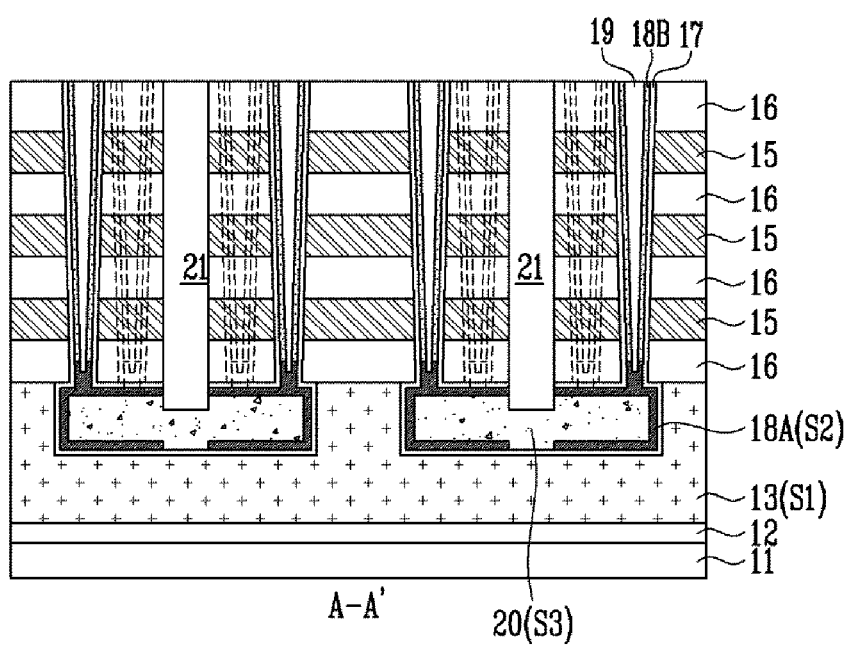
Figure 9C:
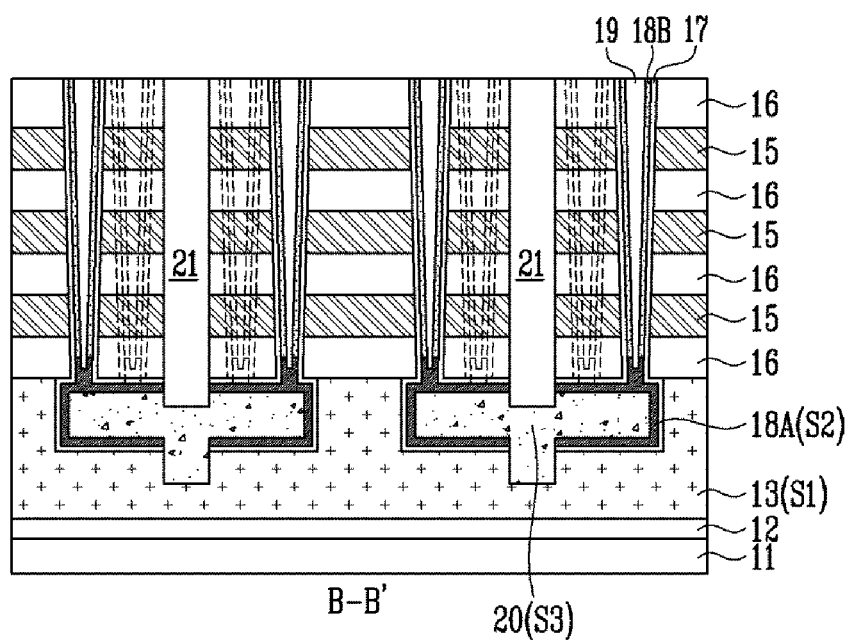
Figure 9D:
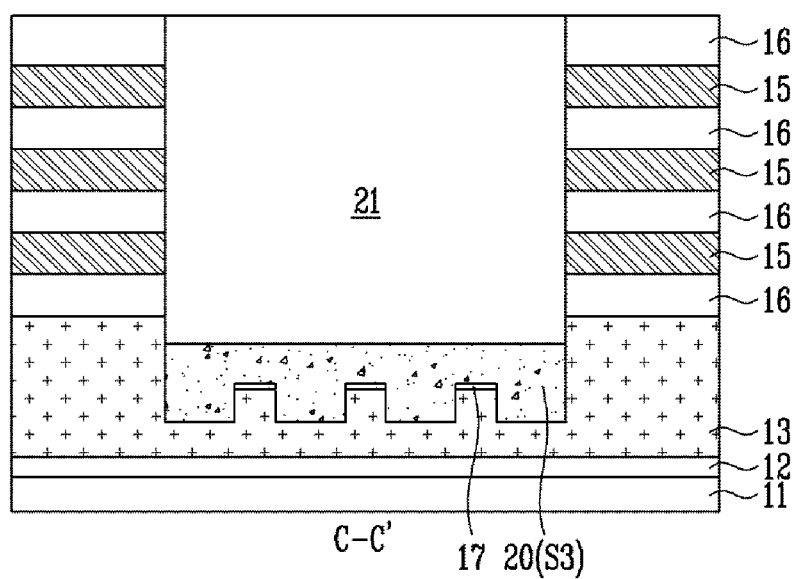

FIGS. 6A and 6B, 7A and 7B, 8A to 8D, 9A to 9D, 10A and 10B, and 11A and 11B are views illustrating a method of manufacturing the semiconductor device according to an embodiment. FIGS. 6A to 11A are layout views, FIGS. 6B to 11B are cross-sectional views taken along line A-A', FIGS. 8C and 9C are cross-sectional views taken along line B-B', and FIGS. 8D and 9D are cross-sectional views taken along line C-C'.

Figure 6A:
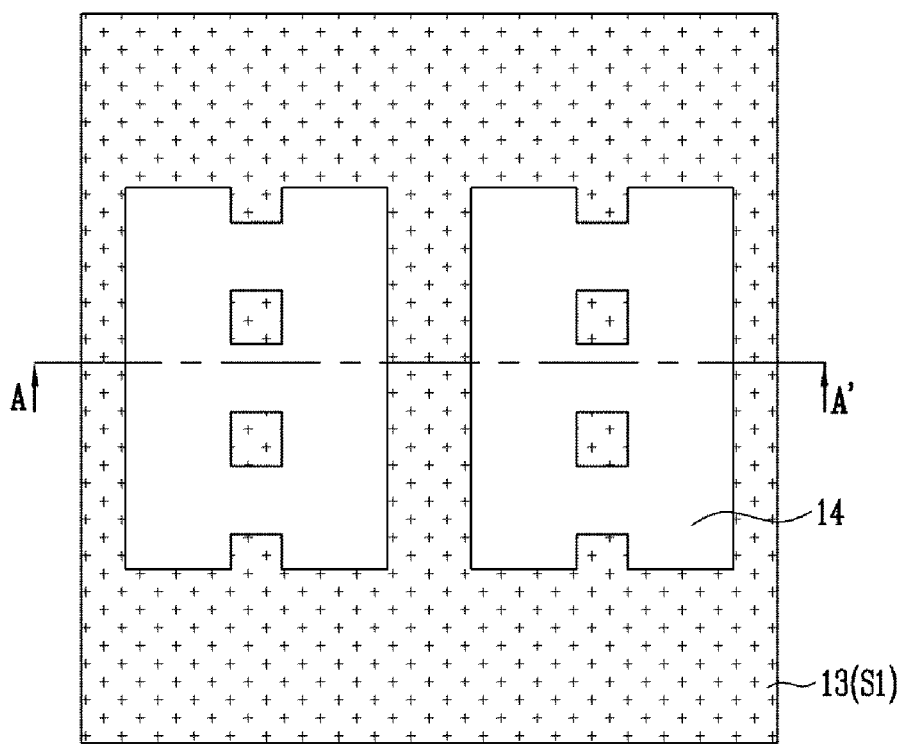
FIGS. 6A and 6B, 7A and 7B, 8A to 8D, 9A to 9D, 10A and 10B, and 11A and 11B are views illustrating a method of manufacturing the semiconductor device according to an embodiment.
Figure 6B:
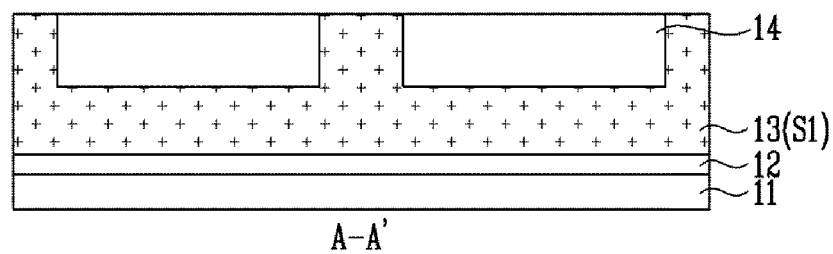

As illustrated in FIGS. 6A and 6B, after an insulating layer 12 is formed substantially over a substrate 11, a first source layer 13(S1) may be formed substantially over the insulating layer 12. The insulating layer 12 may electrically insulate the first source layer 13 from the substrate 11. The insulating layer 12 may comprise an oxide layer. In addition, the first source layer 13 may be a polysilicon layer doped with impurities. In an example, the first source layer 13 may comprise a polysilicon layer doped with N type impurities.

Subsequently, the first source layer 13 may be etched to form trenches. Each of the trenches may define a region in which a second source layer and a third source layer may be formed in subsequent processes. For example, each trench may be in the form of an island, a line, or a combination of an island and a line. In the first embodiment, the trench may be shaped like a ladder consisting of line trenches and island trenches that coupe the line trenches.

Subsequently, sacrificial layers 14 may be formed substantially in the trenches. For example, after the sacrificial layers 14 are formed substantially over the first source layer 13 in which the trenches may be formed, a planarization process may be performed until a surface of the first source layer 13 is exposed. As a result, the sacrificial layer 14 may be formed in each of the trenches. In one example, the sacrificial layer 14 may comprise a nitride layer (SiN) or a titanium nitride layer (TiN).

Figure 7A:
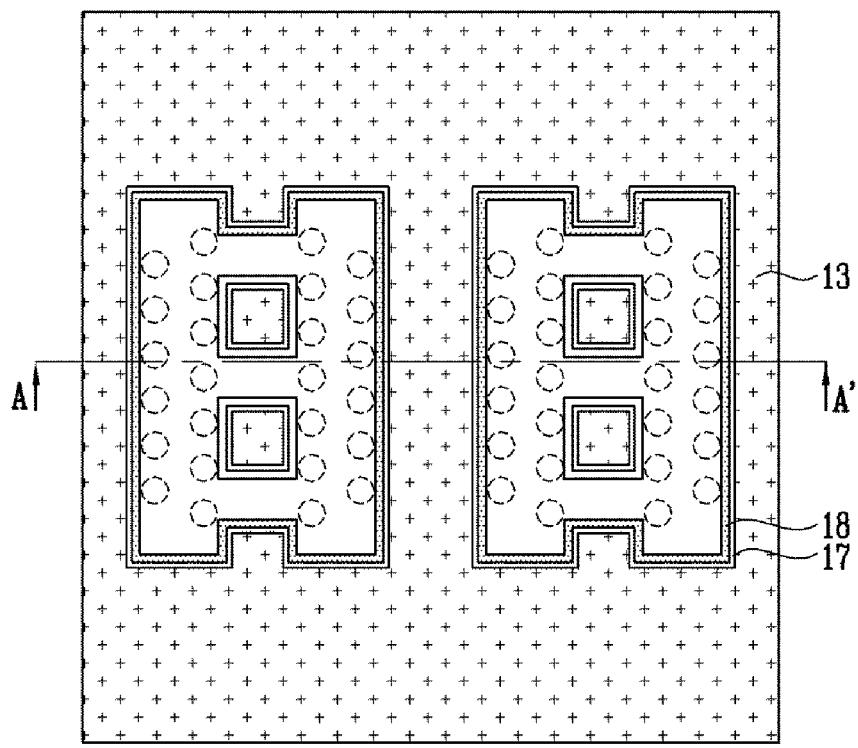
Figure 7B:
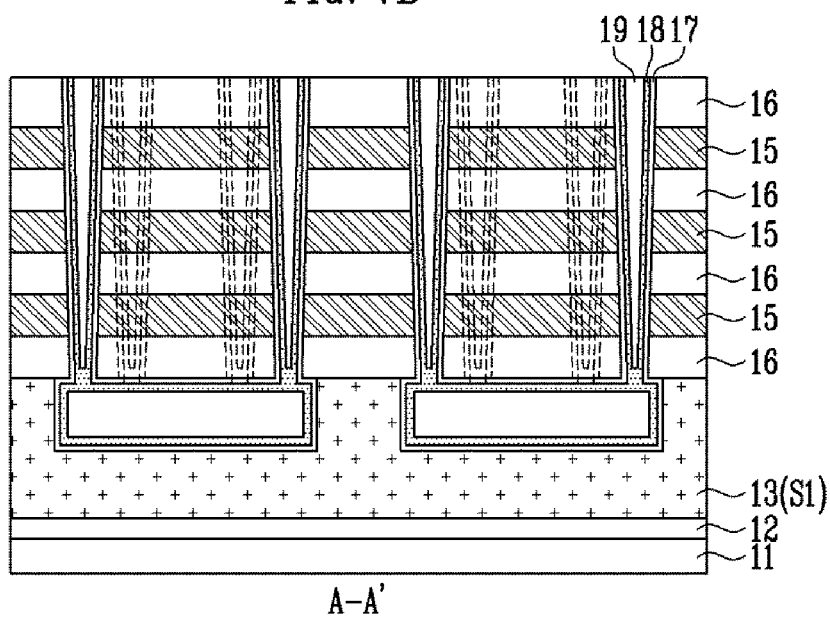

As illustrated in FIGS. 7A and 7B, first material layers 15 and second material layers 16 may be formed alternately over the first source layer 13 or 13(S1) in which the sacrificial layer 14 may be formed. The first material layer 15 may be used to form a conductive layer of a word line, a lower select line, or an upper select line. The second material layer 16 may be used to separate stacked conductive layers from each other. The thickness of the first material layer 15 may vary, depending on its purpose. A conductive layer for an upper select line or a lower select line may have substantially the same thickness as a conductive layer for a word line.

The first material layer 15 and the second material layer 16 may be formed of materials having a high etch selectivity therebetween. In an example, the first material layer 15 may comprise a conductive layer such as a polysilicon layer, and the second material layer 16 may comprise an insulating layer such as an oxide layer. In another example, the first material layer 15 may comprise a conductive layer such as a doped polysilicon layer or a doped amorphous silicon layer, and the second material layer 16 may be formed of a sacrificial layer such as an undoped polysilicon layer or an undoped amorphous silicon layer. In yet another example, the first material layer 15 may comprise a sacrificial layer such as a nitride layer, and the second material layer 16 may comprise an insulating layer such as an oxide layer.

In an embodiment, the first material layer 15 may comprise of a sacrificial layer, and the second material layer 16 may comprise of an insulating layer.

Subsequently, the first material layers 15 and the second material layers 16 may be etched to form channel holes, which may be coupled to each of the trenches. For illustration purposes, positions of channel holes may be indicated by dotted lines in the layout view of FIG. 7A, and channel holes formed behind the cross-section taken along the line A-A' are indicated by dotted lines in the cross-sectional view of FIG. 7B.

Here, the channel holes may taper toward the bottom. The channel holes may be arranged in a matrix or they may alternate with each other. In addition, the channel holes may be divided between both sides of each trench in consideration of a position of a first slit to be formed in subsequent processes. In an example, when the trench may be shaped like a ladder, channel holes may be arranged at positions so that they overlap with the line trench. In another example, when the trench is shaped like an island shape, channel holes may be located at both sides of the trench.

The number of channel holes coupled to each trench may vary depending on an integration degree of the memory device. FIGS. 7A and 7B illustrate that a single trench may be coupled to four channel hole arrays. However, a single trench may be coupled to two, six, eight or ten channel hole arrays.

Subsequently, after the sacrificial layer 14 that is located substantially on the bottom surfaces of the channel holes is removed, a memory layer 17 may be formed substantially along an inner surface of the trench and inner surfaces of the channel holes. The memory layer 17 may be formed to store data and may comprise of a charge blocking layer, a charge trap layer, and a tunnel insulating layer. The charge trap layer may include a nitride layer, nanodots, and a polysilicon layer.

Subsequently, a semiconductor layer 18 may be formed substantially over the memory layer 17. For example, the semiconductor layer 18 may comprise of a polysilicon layer not doped with impurities.

Since the channel holes taper toward the bottom, connecting portions of the trench and the channel holes may be completely sealed before the trench may be entirely filled with the semiconductor layer 18. Therefore, empty space may be formed in the trench. In addition, the channel holes may not be entirely filled with the semiconductor layer 18, and central portions of the channel holes may remain empty. In this case, an insulating layer 19 may be formed substantially at the central portion of the semiconductor layer 18.

As illustrated in FIGS. 8A to 8D, first slits SL1 may pass through each of the trenches. The first slits SL1 may be used to form a second source layer and a third source layer. Each of the first slits SL1 may be formed between the channel holes and extend to the first source layer 13(S1). For example, the first slit SL1 may be located substantially at a central portion of the trench, and an end of the first slit SL1 may be widened to substantially form an I-shape.

In one example, when the trench has a ladder shape, the first slit SL1 may overlap with the island trenches. In addition, after the first material layers 15, the second material layers 16, the memory layer 17, and the semiconductor layer 18 (i.e., 18A(S2) and 18B) are etched, a portion of the first source layer 13 may be etched to a predetermined depth to form the first slit SL1.

Here, the memory layer 17 that may be formed on the bottom surface of each trench may be used as an etch stop layer. As illustrated in FIG. 8B, the first slit SL1 may be formed to a depth that exposes the surface of the memory layer 17 formed on the bottom surface of the island trench (cross-section taken along the line A-A'). As illustrated in FIG. 8C, the first slit SL1 may extend to the first source layer 13(S1) only between the island trenches (cross-section taken along the line B-B'). In addition, as illustrated in FIG. 8D, the first slit SL1 may have unevenness at a bottom surface thereof (cross-section taken along the line C-C').

In another example, in the case where the trench is in the form of an island, after the first material layers 15, the second material layers 16, the memory layer 17, and the semiconductor layer 18 are etched, a portion of the first source layer 13(S1) may be deeply etched to form the first slit SL1. Since the portion of the first source layer 13(S1) may be deeply etched after the memory layer 17 on the bottom surface of the trench is etched, the bottom surface of the first slit SL1 not have unevenness.

Subsequently, the semiconductor layers 18 in the trenches may be doped with impurities to form second source layers 18A(S2). In one example, the semiconductor layer 18 in the trench may be doped with N type impurities through the first slit SL1 by performing a plasma doping process to thus form the second source layer 18A. In another example, an oxide layer doped with impurities may be formed substantially over the semiconductor layer 18, and the impurities included in the oxide layer may be diffused into the semiconductor layer 18 by heat treatment to thus form the second source layer 18A. Subsequently, the oxide layer may be removed therefrom. Therefore, a substantially horizontal region of the semiconductor layer 18 that may be formed in the trench may be used as the second source layer 18A, while a substantially vertical region of the semiconductor layer 18 that passes through the stacked layers, that is, semiconductor pillars 183 may used as channel layers.

For reference, when subsequent processes that involve high temperatures are performed after the second source layer 18A is formed by doping impurities, it may become difficult to control doping concentration because the impurities included in the second source layer 18A may be diffused to another layer. However, according to an embodiment, since the second source layer 18A may be formed by doping impurities after a process of stacking the first and second material layers 15 and 16, respectively, at relatively high temperatures is completed, doping concentration may be easy to control.

As illustrated in FIGS. 9A to 9D, a third source layer 20(S3) may be formed substantially in the second source layer 18A(S2) and Substantially under the first slit SL1 (see FIGS. 8A-8D). For example, a barrier layer may be formed substantially along an inner surface of the first slit SL1 and an inner surface of the trench, in which the second source layer 18A is formed, and a metal layer is formed thereon. Subsequently, the barrier layer and the metal layer may be etched except for where they are formed in the first and second source layers 13 and 18A, respectively, to thus form the third source layer 20. Here, the barrier layer may be any one of a titanium layer (Ti) and a titanium nitride layer (TiN), or a combination thereof, and the metal layer may be a tungsten layer (W). In addition, when the barrier layer and the metal layer are etched, when a tungsten layer, formed under the first slit SL1, in the first source layer 13 is disconnected from a tungsten layer, formed in the trench, in the second source layer 18A, the tungsten layers may be grown by a selective growth process so as to be re-connected.

As described above, when the second source layer 18A, the semiconductor pillars 18B, and the third source layer 20 are formed after the memory layer 17 is formed, the memory layer 17 may substantially surround an outer surface of the second source layer 18A and outer surfaces of the semiconductor pillars 18B. Therefore, unlike the related art, the bottom surfaces of the channel holes are not blocked by the memory layer. Thus, the process of etching the memory layer to expose the source layer may not be performed.

Subsequently the first slit SL1 is substantially filled with an insulating layer 21. Here, the insulating layer 21 may be an oxide layer formed by using High Temperature Oxidation (HTO) or Hugh Density Plasma (HDP) or a flowable oxide layer such as a Spin-On Dielectric SOD (SOD) layer or a polysilazane (PSZ) layer.

Subsequently, though not illustrated in FIGS. 9A to 9D, the first material layers 15 and the second material layers 16 that are stacked in slimming regions may be stepwise patterned. For example, a mask pattern may be formed to substantially cover portions of slimming regions and a cell region, and a process of etching the first material layers 15 and the second material layers 16 may be repeated by gradually reducing the size of the mask pattern, whereby pad portions may be formed at the conductive layers. The pad portions may be coupled to contact plugs by subsequent processes.

Figure 10A:
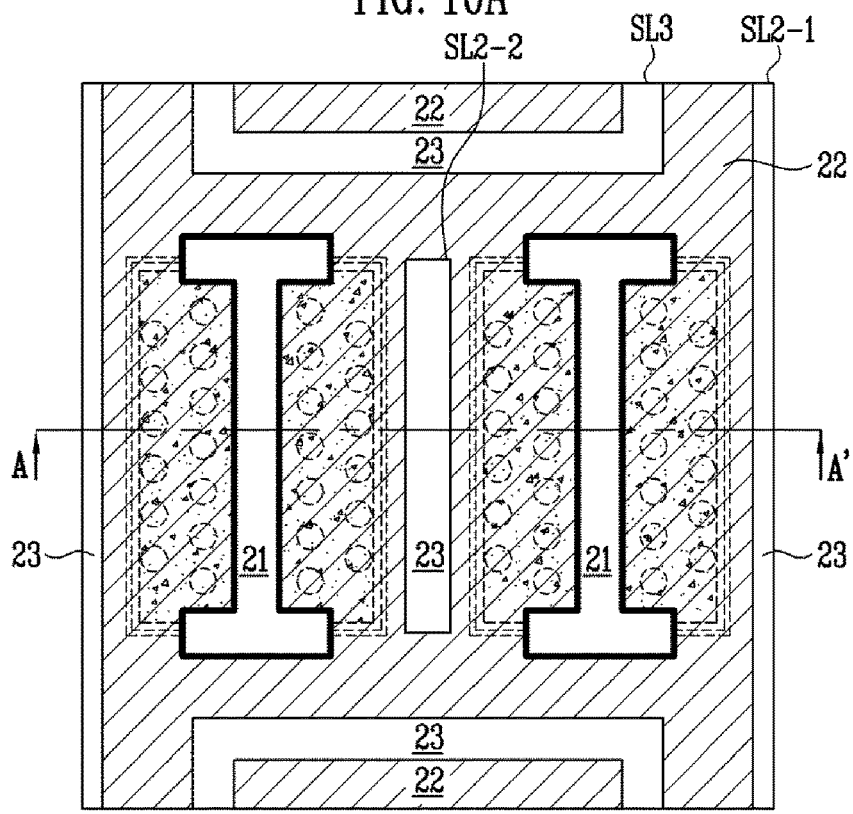
Figure 10B:
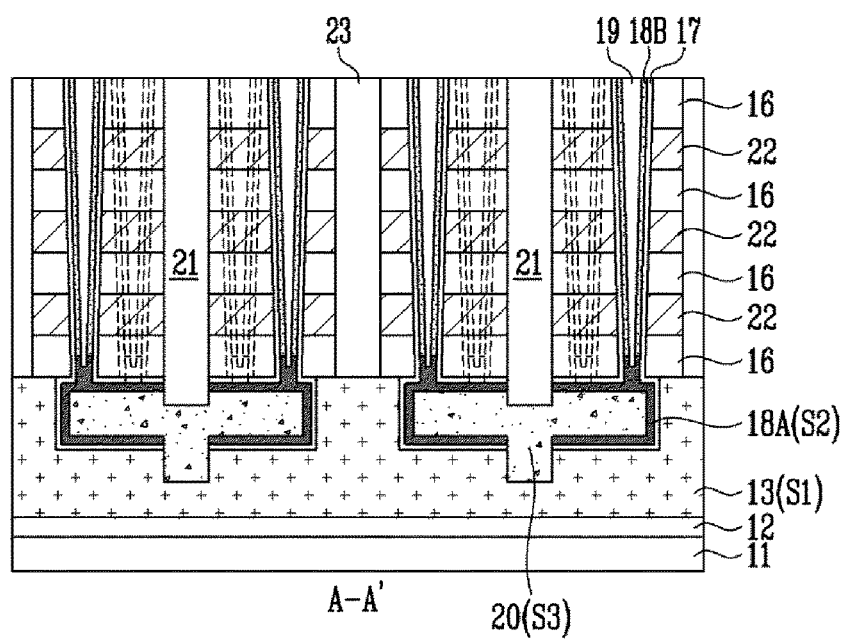

As illustrated in FIGS. 10A and 10B, the first material layers 15 and the second material layers 16 may be etched to form second slits SL2-1 and SL2-2 between the second source layers 18A. For example, the second slits SL2-1 may be formed at interfaces between memory blocks, and the second slits SL2-2 may be formed between the second source layers 18A within a single memory block.

Here, since the second slits SL2-1 formed at interfaces between memory blocks extend to the slimming regions as well as the cell region, each of the second slits SL2-1 may have a length greater than a length of each of the second slits SL2-2 formed substantially between the second source layers 18A. Each of the second slits SL2-2 formed substantially between the second source layers 18A may have a length greater than, smaller than, or equal to the length of each of the first slits SL1. In addition, though not illustrated in FIGS. 10A and 10B, the second slits SL2-1 may have at least one protrusion that protrudes inside the memory block, and an end of each of the second slits SL2-2 formed between the second source layers 18A inside the memory block may be expanded into substantially an I-shape.

One or more thirds slit SL3 may be formed at substantially the same time as the second slits SL2-1 and SL2-2 are formed. The one or more third slits SL3 may be formed substantially in the slimming regions. Here, the third slits SL3 may be formed substantially in or around the slimming regions. In addition, the memory device includes the slimming regions at substantially the top and the bottom with the cell region at the center. The third slits SL3 may be formed substantially in the slimming regions at either or both of the top and bottom. In addition, when the third slits SL3 are formed in slimming regions at the top and bottom, the third slits SL3 may be symmetrical or asymmetrical with respect to each other. In FIGS. 10A and 10B, the third slits SL3 are symmetrically formed around the edges of the slimming regions at the top and bottom.

Subsequently, the first material layers 15 exposed to the second slits SL2-1 and SL2-2 and the third slits SL3 may be etched to form first recessed regions. Conductive layers 22 may be subsequently formed substantially in the first recessed regions. For example, after the conductive layers 22 are deposited to substantially fill the first recessed regions, the conductive layers 22 formed along inner walls of the second slits SL2-1 and SL2-2 may be etched to separate the conductive layers 22 that substantially fill the first recessed regions from each other.

Here, charge blocking layers may be additionally formed in the first recessed regions before the conductive layers 22 are formed. In addition, air gaps may be formed in the first recessed regions by controlling deposition conditions when the conductive layers 22 are formed.

Subsequently, the second slits SL2-1 and SL2-2 and the third slits SL3 may be substantially filled with an insulating layer 23. At this time, air gaps may be formed in the second slits SL2-1 and SL2-2.

Figure 11A:
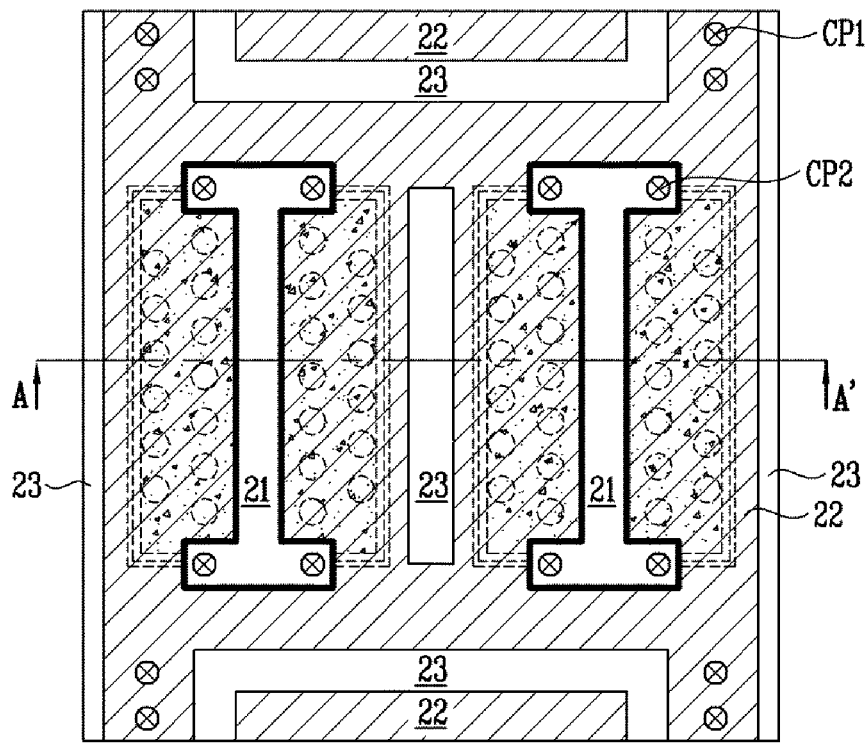
Figure 11B:
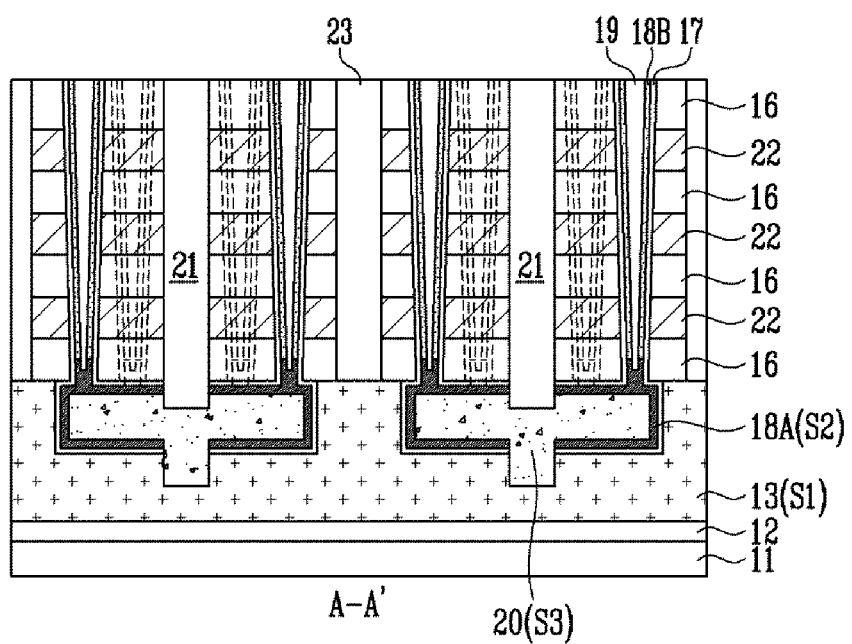

As illustrated in FIGS. 11A and 11B, first contact plugs CP1 may be formed such that the first contact plugs CP1 may be coupled to the conductive layers 22 stacked in the slimming region. In addition, second contact plugs CP2 may be formed such that the second contact plugs CP2 may be coupled to the first source layer 13.

In this manner, the semiconductor device may be formed of the semiconductor pillars 18B coupled to the second source layer 18A(S2) and the first, second, and third source layers 13(S1), 18A(S2), and 20(S3), respectively. As described above, after the memory layer 17 is formed substantially along the inner surface of the trench and the inner surfaces of the channel holes, the second and third source layers 18A(S2) and 20(S3), respectively, and the semiconductor pillars 18B are formed in the memory layer 17. Therefore, an etch process of exposing the source layer on the bottom surfaces of the channel holes may not be performed. Accordingly, manufacturing processes may become easier, and characteristics of the memory device may be improved.

Additionally, various changes may be made to the above-described manufacturing processes, depending on the types of the first material layer 15 and the second material layer 16. In particular, the processes subsequent to the formation of the second slits SL2-1 and SL2-2 may be partly changed.

For example, when the first material layers 15 are formed of conductive layers, and the second material layers 16 are formed of interlayer insulating layers, the first material layers 15 exposed to the second slits SL2-1 and SL2-2 may be silicided after the second slits SL2-1 and SL2-2 are formed. Subsequently, the second slits SL2-1 and SL2-2 may be substantially filled with the insulating layer 23.

In another example, when the first material layers 15 are formed of conductive layers, and the second material layers 16 are formed of sacrificial layers, the second material layers 16 exposed to the second slits SL2-1 and SL2-2 may be selectively etched to form second recessed regions. Subsequently, the first material layers 15 exposed to the second slits SL2-1 and SL2-2 may be silicided, and the second recessed regions and the second slits SL2-1 and SL2-2 may be substantially filled with the insulating layer 23.

Figure 12:
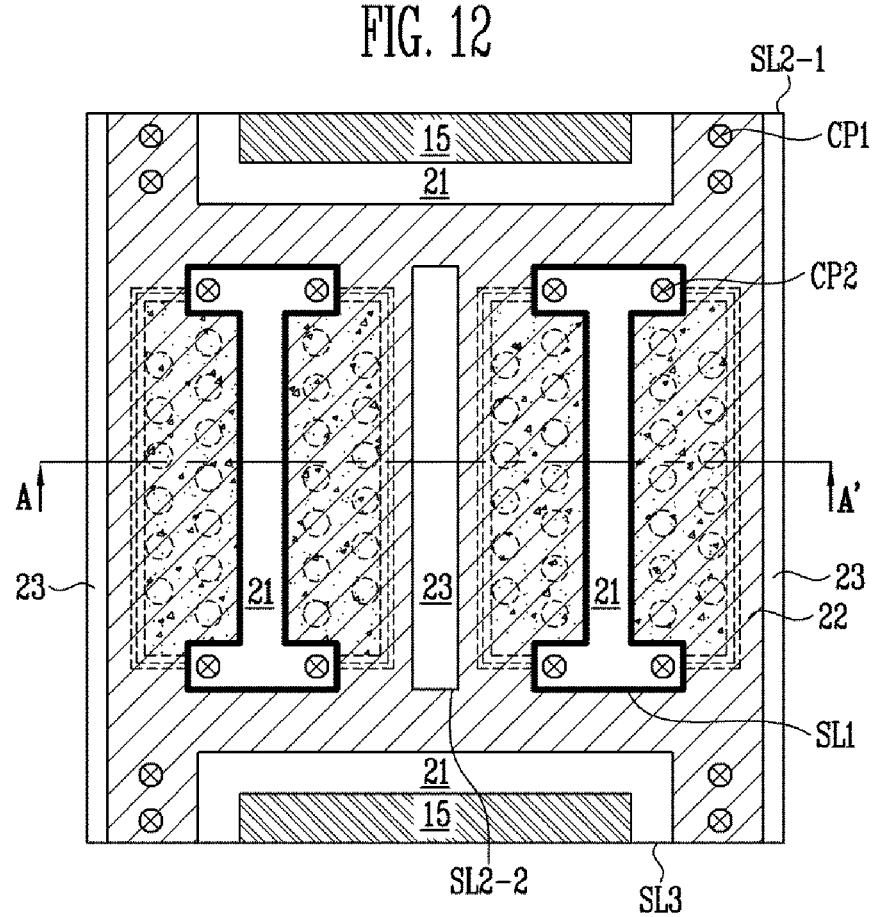
FIG. 12 is a layout view of a semiconductor device according to an embodiment.

FIG. 12 is a layout view of a semiconductor device according to another embodiment. Here, a description of the contents of the embodiment, overlapping with those of the prior embodiment, is omitted.

As illustrated in FIG. 12, the semiconductor device according to the second embodiment may include at least one of a third slit SL3 that may be substantially located in the slimming regions. The third slit SL3 may be formed at substantially the same time as the first slits SL1 are formed. In this example, the second slits SL2-1 and SL2-2 may be formed after the third slit SL3 is substantially filled with the insulating layer 21, The insulating layer 21 substantially filling the third slit SL3 may serve as a support during the process of forming the first recessed regions. Therefore, the insulating layer 21 may prevent the remaining second material layers 16 from collapsing during the process of forming the first recessed regions. In addition, the first material layers 15, substantially surrounded by the third slit SL3, in the slimming region may not be etched, but may remain.

Figure 13:
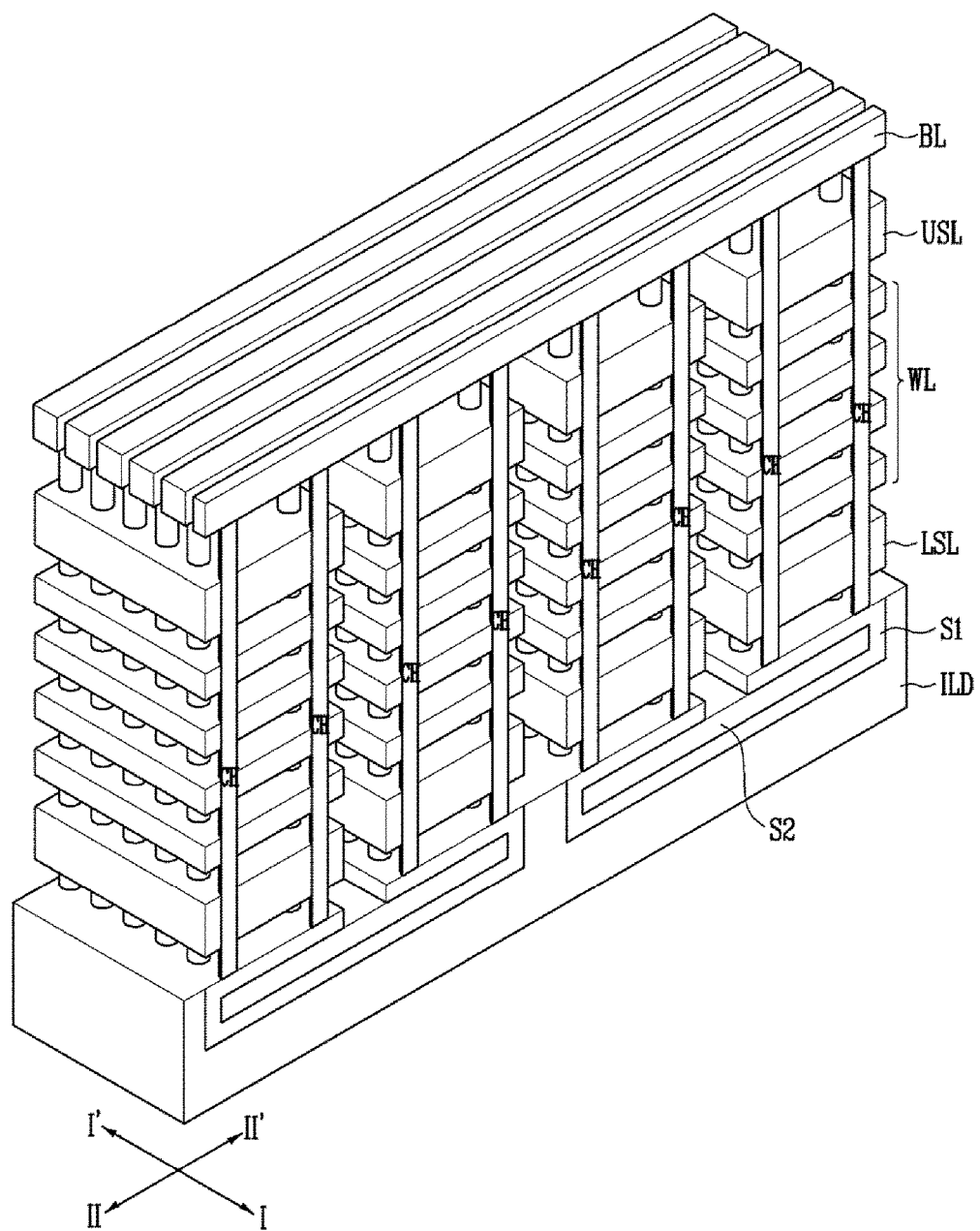
FIG. 13 is a perspective view of the structure of a semiconductor device according to an embodiment.

FIG. 13 is a perspective view of the structure of a semiconductor device according to another embodiment. Here, a description of the contents of this embodiment, overlaps with those of the prior embodiments, and is thus omitted.

As illustrated in FIG. 13, the semiconductor device according to this embodiment may include an interlayer insulating layer ILD, one or more first source layers S1 formed substantially in the interlayer insulating layer ILD, a plurality of conductive layers stacked substantially over the interlayer insulating layer ILD, semiconductor pillars passing through the conductive layers and coupled to the one or more the first source layers S1, and a second source layer S2 formed substantially in each of the first source layers S1. In addition, the semiconductor device may further include memory layers (not illustrated) and bit lines BL. Each of the memory layers (not illustrated) may substantially surround an outer surface of the first source layer S1 and outer surfaces of the semiconductor pillars. The bit lines BL may be formed substantially over the conductive layers and extend substantially in the second direction II-II'.

The semiconductor pillars may be used as the channel layers CH, and the conductive layers may be used as the lower select line LSL, the word lines WL, and the upper select line USL.

In addition, the first source layer S1 may be formed by doping the semiconductor layer with impurities, and the second source layer S2 may be formed of a metal layer. In this case, source resistance may be reduced to improve characteristics of the memory device.

In FIG. 13, the first source layer S1 may completely surround the bottom surface of each second source layer S2. However, a portion of the bottom surface of the second source layer S2 may protrude and pass through the first source layer S1.

Figure 14:
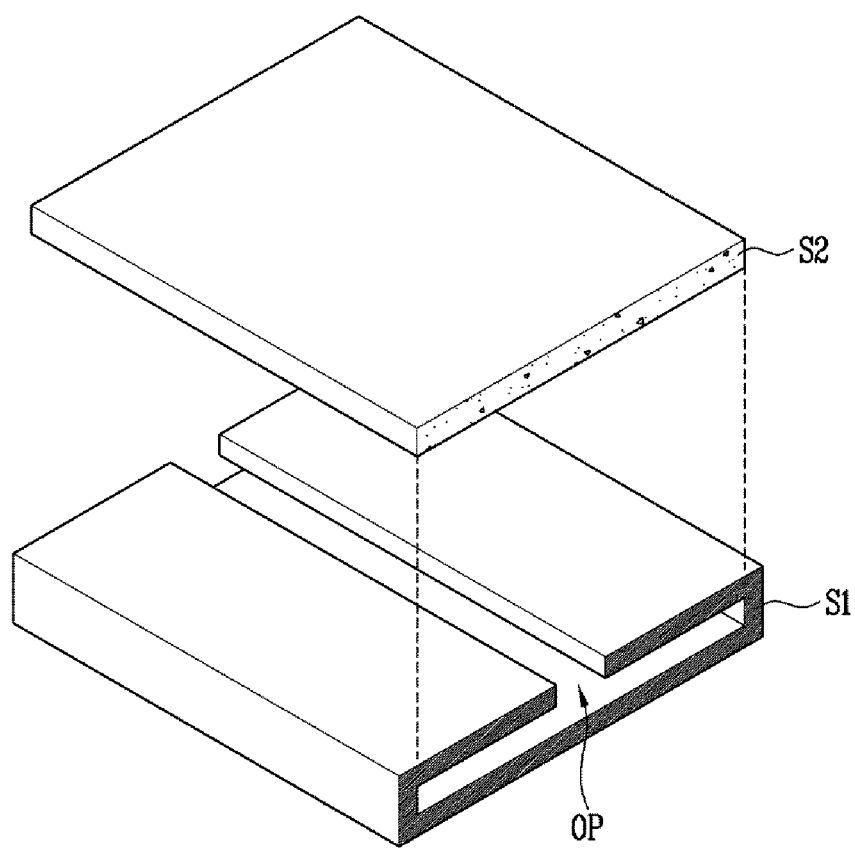
FIG. 14 is an exploded perspective view of a source layer structure of the semiconductor device according to an embodiment.

FIG. 14 is an exploded perspective view of a source layer structure of the semiconductor device according to the above embodiment.

As illustrated in FIG. 14, the second source layer S2 may be formed substantially in the first source layer S1, and the first source layer S1 substantially surrounds a top surface, a side surfaces, and a bottom surface of the second source layer S2, Here, the first source layer S1 may include at least one opening OP that may be formed substantially in the top surface thereof. The opening OP may be substantially in the form of a line.

In addition, though not illustrated in FIG. 14, the first source layer S1 may further include at least one opening that may be formed substantially in the bottom surface thereof. In this case, the second source layer S2 may have a protrusion on the bottom surface thereof, and the protrusion may substantially protrude through the opening OP.

Figure 15A:
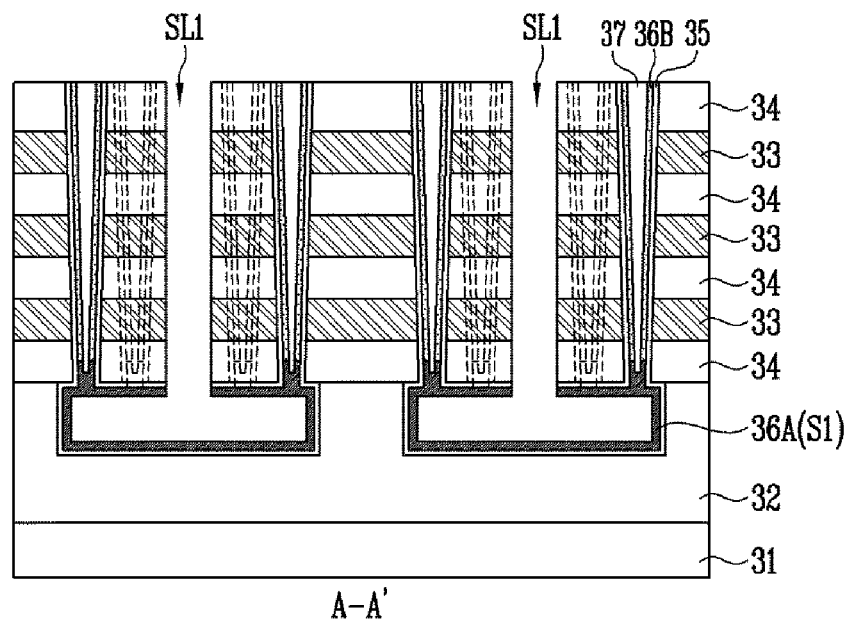
FIGS. 15A and 15B are cross-sectional views illustrating a method of manufacturing the semiconductor device according to an embodiment.
Figure 15B:
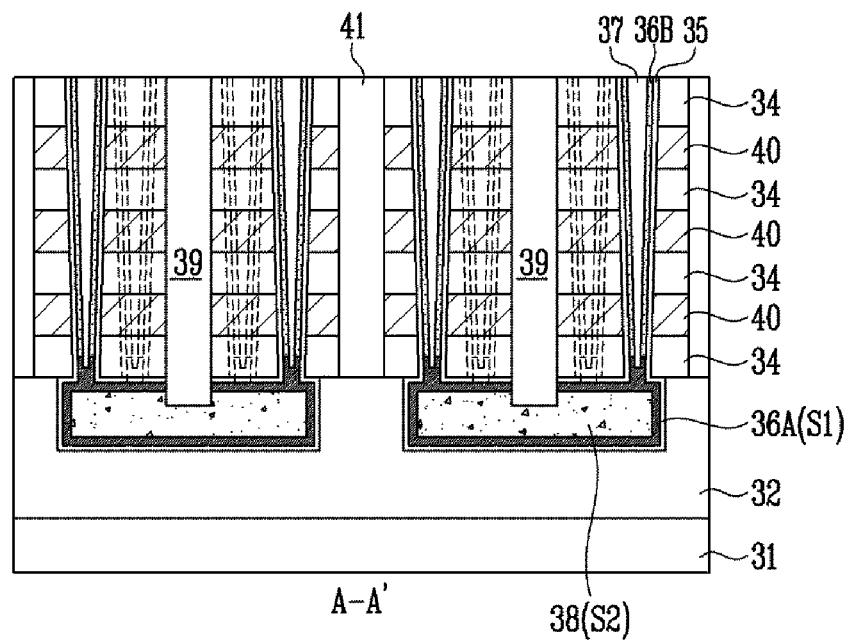

FIGS. 15A and 15B are cross-sectional views illustrating a method of manufacturing the semiconductor device according to the above embodiment. Here, a description of the contents of the above embodiment, overlapping with those of the other embodiments, is omitted.

As illustrated in FIG. 15A, after an interlayer insulating layer 32 is formed substantially over a substrate 31, the interlayer insulating layer 32 may be etched to form trenches. Subsequently, a sacrificial layer (not illustrated) may be formed substantially in each of the trenches.

Subsequently, first material layers 33 and second material layers 34 may be formed alternately substantially over the interlayer insulating layer 32 in which the sacrificial layer may be formed. The first material layers 33 may be used to form conductive layers of word lines, a lower select line, and an upper select line. The second material layers 34 may be used to separate the stacked conductive layers from each other. In an embodiment, the first material layers 33 may comprise sacrificial layers, and the second material layers 34 may comprise insulating layers.

Subsequently, the first material layers 33 and the second material layers 34 may be etched to form channel holes, which may be coupled to the trench. Subsequently, after the sacrificial layer formed substantially on the bottom surfaces of the channel holes are removed, a memory layer 35 may be formed substantially along inner surfaces of the channel holes and an inner surface of the trench. Subsequently, after a semiconductor layer is formed substantially over the memory layer 35, an insulating layer 37 may be formed substantially at open central regions in the channel holes.

Subsequently, the first slits SL1 may be formed substantially between the channel holes such that the first slits SL1 may extend to the trench. Here, the memory layer 35 and the semiconductor layer formed substantially on the bottom surface of the trench may be used as an etch stop layer. Alternatively, the first slits SL1 may extend to the interlayer insulating layer 32.

Subsequently, the semiconductor layers in the trenches may be doped with impurities to form first source layers 36A(S1). Here, semiconductor pillars 36B, not doped with impurities, may be used as channel layers.

As illustrated in FIG. 15B, second source layers 38(S2) may be formed substantially in the first source layers 36A (S1). When the first slits SL1 extend to the interlayer insulating layer 32, the second source layer 38 may substantially fill a lower portion of each of the first slits SL1. Subsequently, each first slit SL1 may be substantially filled with an insulating layer 39.

Subsequently, second slits may be formed between the first source layers 36A by etching the first material layers 33 and the second material layers 34. Subsequently, the first material layers 33 exposed in the second slits may be etched to form first recessed regions. Conductive layers 40 may be subsequently formed substantially in the first recessed regions. The second slits may be substantially filled with an insulating layer 41.

Subsequently, though not illustrated in FIG. 15B, first contact plugs may be formed substantially at slimming regions such that the first contact plugs may be coupled to the conductive layers 40. In addition, second contact plugs may be formed such that the second contact plugs may be coupled to the second source layers 38(S2).

Figure 16A:
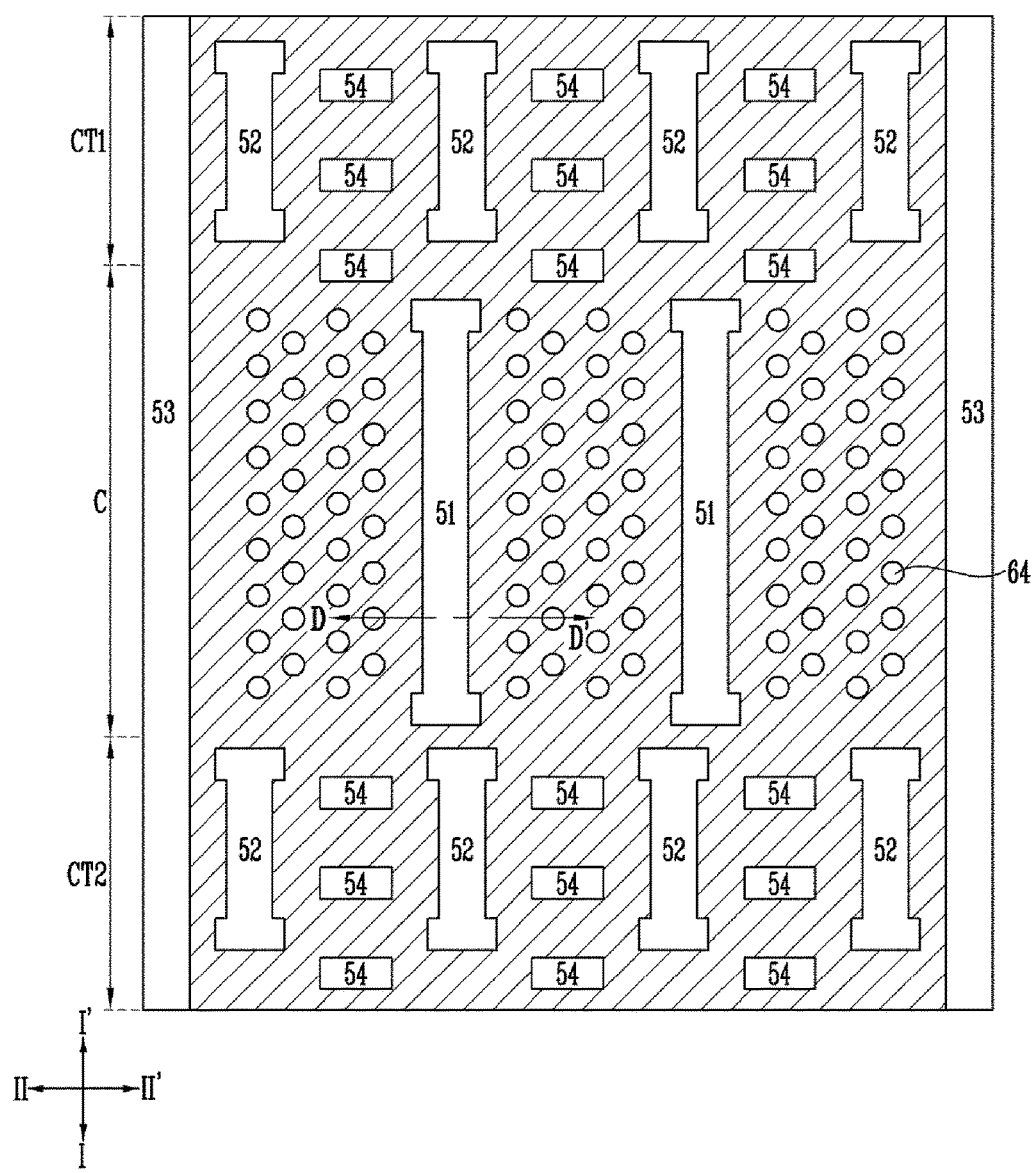
FIGS. 16A and 16B are views illustrating the structure of a semiconductor device according to an embodiment.
Figure 16B:
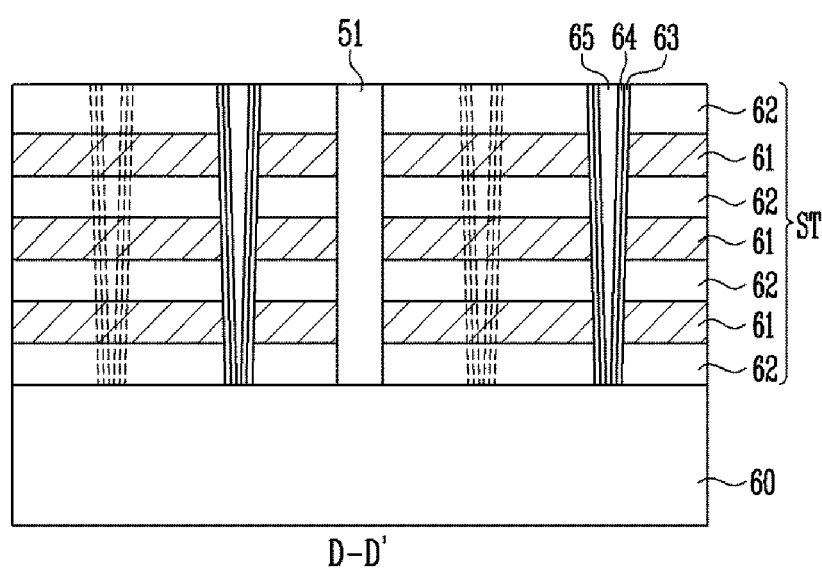

FIGS. 16A and 16B are views illustrating the structure of a semiconductor device according to an embodiment where FIG. 16A is a layout view and FIG. 16B is a cross-sectional view.

Referring to FIGS. 16A and 16B, a semiconductor device according to an embodiment includes a source structure 60, a stack ST, channel layers 64, and slit insulating layers 51 to 54.

The source structure 60 is located at a lower portion of the stack ST and is coupled to the channel layers 64. The source structure 60 may have a structure described above in relation to FIGS. 3 to 15B. Additionally, the source structure 60 may be a polysilicon layer or metal layer in the form of a plate, or may have a structure that the polysilicon layers and the metal layers are stacked.

The stack ST includes alternately stacked conductive layers 61 and insulating layers 62. Here, at least one uppermost conductive layer 61 may be an upper select line, at least one lowermost conductive layer 61 may be a lower select line, and the remaining conductive layers 61 may be word lines.

In addition, the stack ST may include a cell region C and contact regions CT1 and CT2. Memory strings may be located in the cell region C, and interconnections for applying biases to the memory strings may be located in the contact regions CT1 and CT2. For example, the cell region C may be located between a first contact region CT1 and a second contact region CT2.

The channel layers 64 may pass through the stacks ST in a stacking direction to abut onto the source structure 60. The channel layers 64 may have a form in which even a central portion is completely filled or in which the central portion is open. The opened central portion may be filled with insulating patterns 65.

In addition, memory layers 63 may be intervened between conductive layers 61 of the channel layers 64. The memory layers 63 may include at least one of a tunnel insulating layer, a data storing layer, and a charge blocking layer, and the data storing layer may include polysilicon, nitride materials, phase change materials, and nano-dots, etc.

The slit insulating layers 51 to 54 pass through the stack ST in the stacking direction. The slit insulating layers 51 to 54 may completely pass through the stack ST to abut onto the source structure 60 or may pass through only a portion of the stack ST. For example, the slit insulating layers 51 to 54 may pass through all the lower select lines, the word lines, and the upper select lines included in the stack ST, only the lower select lines, only the upper select lines, or pass through only the word lines and the upper select lines.

In addition, the slit insulating layers 51 to 54 may be located in the cell region C, in the contact regions CT1 and CT2, on the boundary between the cell region C and the contact regions CT1 and CT2, or may be located across the cell region C and the contact regions CT1 and CT2.

First slit insulating layers 51 may be located at the cell region C and may have a form of which at least one end extends. For example, the first slit insulating layers 51 may be in the form of a line extending in a first direction I-I' and may have an I-shape in which the widths of ends extend.

Second slit insulating layers 52 may be located at the contact regions CT1 and CT2 and may have a shape in which at least one end extends. For example, the second slit insulating layers 52 may be in the form of a line extending in the first direction I-I' and may have an I-shape in which the widths of ends extend. In addition, the second slit insulating layers 52 may have shorter lengths than the first slit insulating layers 51.

Third slit insulating layers 53 may extend in the first direction I-I' across the first contact region CT1, the cell region C, and the second contact region CT2, and may be located on the boundaries between adjacent memory blocks.

Here, the memory block may be a data deletion unit. The third slit insulating layers 53 may be in the form of a line with a uniform width or may have a shape in which at least one end extends.

Fourth slit insulating layers 54 may be located at the contact regions CT1 and CT2 and may be located between the adjacent second slit insulating layers 52. The fourth slit insulating layers 54 may be in the form of islands of which the widths in a second direction may be larger than those in the first direction I-I'. In addition, the fourth slit insulating layers 54 may have the uniform width or may have a shape in which at least one end extends.

A method for manufacturing the slit insulating layers 51 to 54 will be described briefly as follows. Firstly, a stack in which first material layers and second material layers are alternately stacked is formed and then slits passing through the stack is formed. Then, the first material layers are replaced with third material layers through the slits. At this point, during the process in which the first material layers are replaced with the third material layers, an etching process for separating the stacked third materials from each other and removing the third material layers remaining in the slits may be additionally performed. Then the slit insulating layers 51 to 54 are formed in the slits.

However, as the aspect ratio of the slit becomes larger, a profile may be modified such that the width of the slit is reduced in a certain level or smaller. In particular, for an end of the slit, the profile may be severely modified and the end may have a sharp shape. In this case, the third material layer remaining at the sharp end of the slit may not be completely removed to cause a bridge. According to an embodiment, in consideration of a degree that the end width of the slit is reduced, ends of the slit insulating layers 51 to 54 are extended. In this case, although the slit profile is modified according to the level, a prescribed width may be maintained.

Figure 17A:
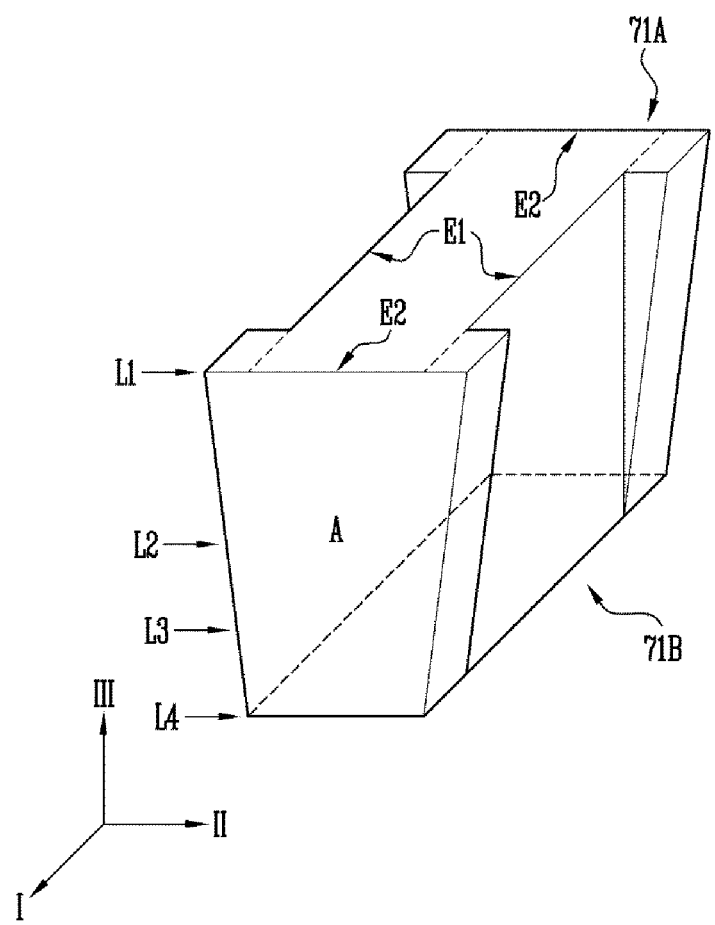
Figure 17D:
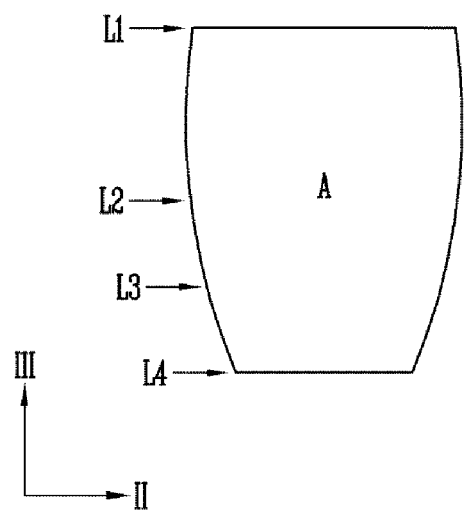
Figure 17E:
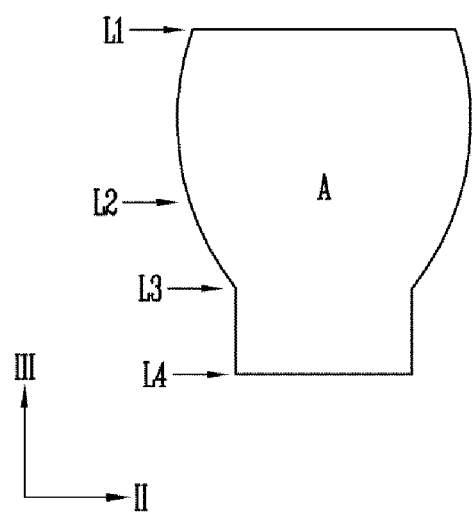

FIGS. 17A to 17E are views illustrating a structure of a slit insulating layer according to an embodiment. Here, FIG. 17A is a perspective view, FIGS. 17B and 17C are cross-sectional views of the I-II plane, and FIGS. 17D and 17E are cross-sectional views of A of the II-III plane.

Referring to FIGS. 17A to 17E, the slit insulating layer according to an embodiment has a shape in which the end extends. For example, the slit insulating layer includes a main pattern M and at least one protruding pattern P coupled to the main pattern M. Here, the protruding pattern P is to extend the width of the end of the slit insulating layer and is coupled to the end of the main pattern M. For example, the protruding pattern P abuts onto edges E1 and E2 and/or corners CN of the ends of the main pattern M.

The main pattern M includes a first edge E1 extending in a first direction I and a second edge E2 extending in a second direction II. Here, when the first edge E1 has a longer length than the second edge E2 and the main pattern M extends in the first direction, the protruding pattern P may protrude from the first edge E1 in the second direction II. Accordingly, the slit insulating layer may include the main pattern M extending in the first direction I and the protruding pattern P protruding from the first edge E1 in the second direction II. For reference, it is also possible that the second edge E2 has a longer length than the first edge E1 and the main pattern M extends in the second direction II, and the protruding pattern P may protrude from the second edge E2 in the first direction I. In addition, the slit insulating layer may have a structure obtained by combining the above-described. For example, the slit insulating layer may include both the protruding pattern P protruding from the second edge E2 in the first direction I and the protruding pattern P protruding from the first edge E1 in the second direction II.

In the present embodiment, it is illustrated that 4 protruding patterns P are respectively coupled to both ends of the main pattern M, but the number, width, and area, etc. of the protruding patterns P may be variously changed. For example, the protruding patterns P may be coupled to only one end of the main pattern M. The protruding patterns P may be coupled to both sides with the main pattern M intervened therebetween or may be coupled to only one side. The protruding patterns P, which are positioned opposite to each other with the main pattern M intervened therebetween, may have a symmetric form or asymmetric form. In addition, the protruding patterns P may be respectively coupled to corners of the main pattern M or may be coupled to only some of the corners.

The protruding pattern P may have a first width W1 in the first direction I, the main pattern M may have a third width W3 in the second direction II, and the ends of the slit insulating layer may have a second width W2 in the second direction II. Here, the end of the slit insulating layer may have a wider width than the main pattern M and may satisfy a condition [W3<W2≤2W3]. In addition, the first width W1 of the protruding pattern P and the third pattern W3 of the main pattern M may satisfy a condition [0.5*W3≤W1]. For example, the first width W1 and the third width W3 may have substantially the same value or the first width W1 may have a larger value than the third width W3. Here, the term "substantially" means not only that two values are the same but that the two values belong to a range including an error in process.

On the other hand, the slit insulating layer may have a structure that the height is larger than the width, namely, a structure having a large aspect ratio. In this case, a cross-sectional area of the lower surface 71B of the slit insulating layer is smaller than that of the upper surface 71A of the slit insulating layer. Hereinafter, the uppermost portion of the slit insulating layer is defined as a first level L1, the lowermost portion is defined as a fourth level L4, and a description will be provided about a shape change according to the first to fourth levels (where L1>L2>L3>L4).

The cross-sectional area of the slit insulating layer may vary according to the levels L1 to L4, and may increase or decrease as a result of proceeding from the upper portion to the lower portion. At this point, all cross-sectional areas of the main pattern M and the protruding patterns P may increase or decrease, or only the cross-sectional area of the protruding patterns P may increase or decrease with the cross-sectional area of the main pattern M maintained. Referring to FIG. 17A, the cross-sectional area of the slit insulating layer may decrease from the first level L1 to the fourth level L4. Referring to FIG. 17D, the cross-sectional area of the slit insulating layer may increase from the first level L1 to the second level L2, and may decrease from the second level L2 to the fourth level L4 (See A). Referring to FIG. 17E, the cross-sectional area of the slit insulating layer may increase from the first level L1 to the second level L2, decrease from the second level L2 to the third level L3, and may be maintained substantially the same from the third level L3 to the fourth level L4.

In addition, the slit insulating layer may vary in shape according to the levels L1 to L4. At this point, all the main pattern M and the protruding pattern P vary and only the protruding pattern M may vary with the shape of the main pattern M maintained. As one example, the protruding pattern P of the first level L1 may have a polygonal shape having corners, and the protruding pattern P of the second level L2 may have a circular or elliptical shape. For another example, the slit insulating layer may include the protruding pattern P from the first level L1 to the third level L3 and may not include the protruding pattern P at the third level L3 or lower.

Accordingly, the upper surface 71A and the lower surface 71B of the slit insulating layer may have different shapes and the lower surface 71B may have a narrower cross-sectional area than the upper surface 71A. For example, the upper surface 71A may include the main pattern M extending in the first direction I-I' and a protruding pattern P protruding in the second direction II-II' and the lower surface 71B may only include the main pattern M having the uniform width. In this case, the lower surface 71B may have the uniform width of a third width W3.

FIGS. 18A to 18G are layout views illustrating a cross-sectional shape of a slit insulating layer according to an embodiment. Hereinafter, a description of the contents of the above embodiment, overlapping with those of the other embodiments, will be omitted.

Figure 18A:
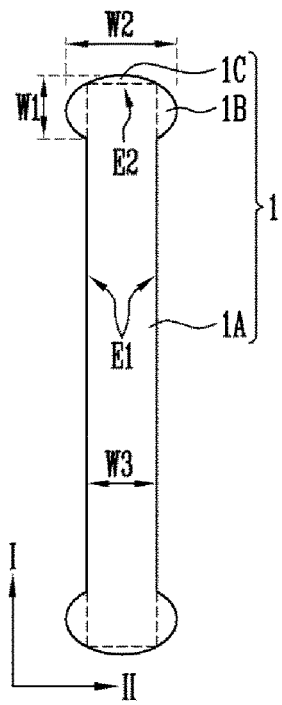
FIGS. 18A to 18G are layout views illustrating a cross-sectional shape of a slit insulating layer according to an embodiment.

Referring to FIG. 18A, the slit insulating layer includes a main pattern 1A extending in one direction and first and second protruding patterns 1B and 1C coupled to ends of the main pattern 1A. Here, the first protruding patterns 1B may abut onto first edges E1 of the main pattern 1A and the second protruding patterns 1C may abut onto second edges E2 of the main pattern 1A. In this case, corners of the main pattern 1A may be enclosed by the first and second protruding patterns 1B and 1C.

In addition, the protruding patterns 1B and 1C have circular or elliptical cross sections with a prescribed curvature. In this case, the first protruding patterns 1B have the longest width W1 in a first direction I, the main pattern 1A has a third width W3 in a second direction II, and the ends of the slit insulating layer 1 have a second width W2 in the second direction II. Here, the second width W2 and the third width W3 may satisfy a condition [W3<W2≤2W3]. In addition, the first width W1 and the third width W3 may satisfy a condition [0.5*W3≤W1], and the first width W1 and the third width W3 may have substantially the same value or the first width W1 may have a larger value than the third width W3.

Figure 18B:
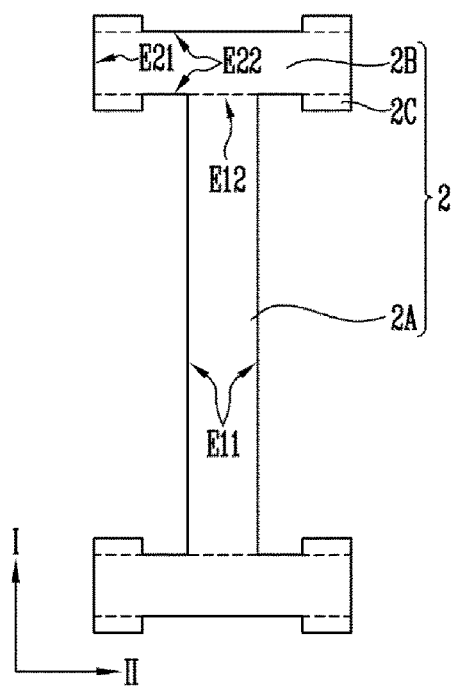

Referring to FIG. 18B, a slit insulating layer 2 includes a first main pattern 2A, second main patterns 2B, and protruding patterns 2C. Here, the first main pattern 2A includes first edges E11 extending in a first direction I and second edges E12 extending in a second direction II. The second main patterns 2B include first edges E21 extending in the first direction I and second edges E22 extending in the second direction II. In addition, the second edges E12 of the first main pattern 2A and the second edges E22 of the second main pattern 2B abut onto each other. Accordingly, the second main patterns 2B intersect with the first main pattern 2A and are coupled to the ends of the first main pattern 2A. For example, the first main pattern 2A and the second main patterns 2B are coupled in a T shape, and the ends of the slit insulting layer 2 have the T shape. In addition, both ends of the slit insulating layer 2 may have the T shape and, in this case, the slit insulating layer 2 may have an I-shape.

In addition, since the second main patterns 2B abut onto the ends of the first main pattern 2A, the ends and corners of the first main pattern 2A are not exposed. Accordingly, the protruding patterns 2C may be coupled only to the ends of the second main pattern 2B and may not be coupled to the first main pattern 2A. Here, the protruding patterns 2C may have a polygonal shape.

Figure 18C:
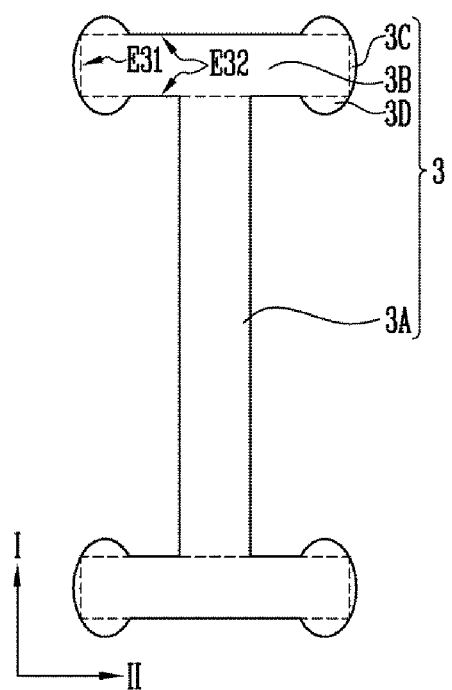

Referring to FIG. 18C, the slit insulating layer 3 includes a first main pattern 3A, second main patterns 3B, first protruding patterns 3C and second protruding patterns 3D. Here, the second main patterns 3B intersect with the first main pattern 3A and are coupled to the ends of the first main pattern 3A. In addition, the first protruding patterns 3C are coupled to first edges E31 of the second main patterns 3B, and the second protruding patterns 3D are coupled to second edges E32 of the second main patterns 3B. Accordingly, corners of the second main patterns 3B may be completely enclosed by the first and second protruding patterns 3C and 3D.

Figure 18D:
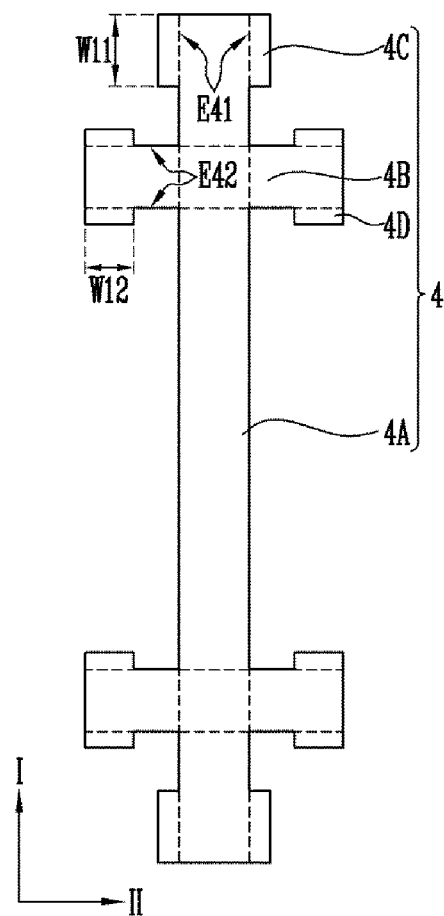

Referring to FIG. 18D, the slit insulating layer 4 includes a first main pattern 4A, second main patterns 4B, first protruding patterns 4C and second protruding patterns 4D. Here, the second main patterns 4B are separated from the outermost ends of the first main pattern 4A by a prescribed distance to be coupled to the first main pattern 4A, and extends across the first main pattern 4A. For example, the first main pattern 4A and the second main patterns 4B are coupled in a cruciform shape, and the ends of the slit insulting layer 4 have the cruciform shape.

In addition, since the ends of the first main pattern 4A and the ends of the second main patterns 4B are exposed, the first and second protruding patterns 4C and 4D are coupled to the ends of the first and second main patterns 4A and 4B. For example, the first protruding patterns 4C are coupled to first edges E41 of the first main pattern 4A, and the second protruding patterns 4D are coupled to second edges E42 of the second main pattern 4B. The first and second protruding patterns 4C and 4D may have polygonal shapes.

Here, the first protruding patterns 4C and the second protruding patterns 4D may have substantially the same width or different widths. For example, the first protruding patterns 4C, which are located at the outermost ends of the slit insulating layer 4, may have a wider width (W11>W12) than the second protruding patterns 4D.

Figure 18E:
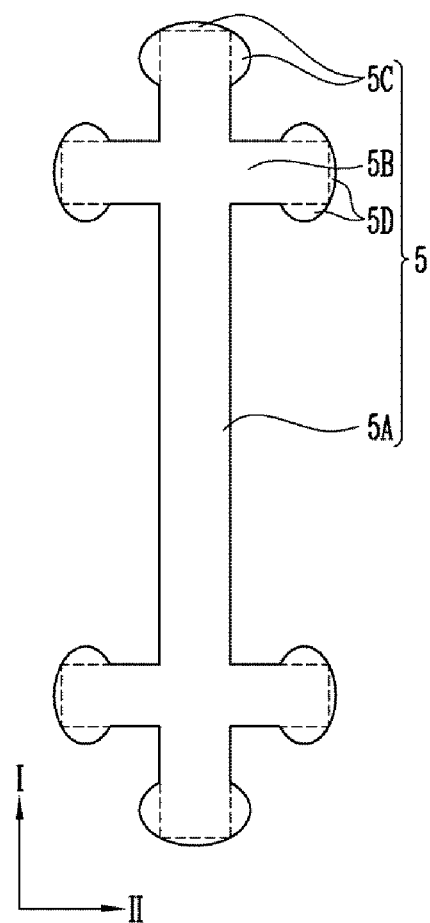

Referring to FIG. 18E, the slit insulating layer 5 includes a first main pattern 5A, second main patterns 5B, first protruding patterns 5C and second protruding patterns 5D. Here, the second main patterns 5B extend across the first main pattern 5A. For example, the first main pattern 5A and the second main patterns 5B are coupled in a cruciform shape, and the ends of the slit insulting layer 5 have the cruciform shape. In addition, the first protruding patterns 5C are coupled to the ends of the first main pattern 5A and the second protruding patterns 5D are coupled to the ends of the second main pattern 5B. Here, the first and second protruding patterns 5C and 5D may have a circular or elliptical shape.

Figure 18F:
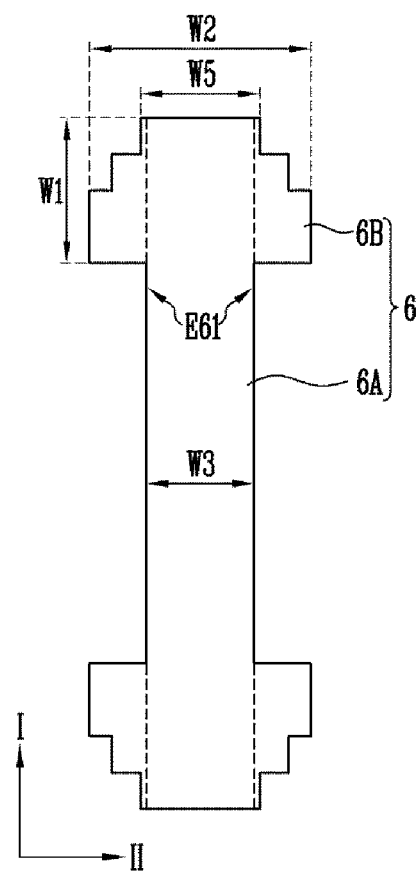

Referring to FIG. 18F, a slit insulating layer 6 includes a main pattern 6A and protruding patterns 6B. Here, the protruding patterns 6B are coupled to abut onto first edges E61 of the main pattern 6A. The protruding patterns 6B has a first width W1 in a first direction I, the main pattern 1A has a third width W3 of a second direction II, and the ends of the slit insulating layer 6 have a second width W2 that is the longest in the second direction II. For example, the second width W2 and the third width W3 may satisfy a condition [W3<W2≤2W3]. In addition, the first width W1 and the third width W3 may satisfy a condition [0.5*W3≤W1], and the first width W1 and the third width W3 may have substantially the same value or the first width W1 may have a larger value than the third width W3.

In addition, at least one edge of the protruding patterns 6B may have a stepwise shape. As one example, the slit insulating layer 6 may have a shape in which the width of the end extends but the width thereof decreases as proceeding to the outermost end. In this case, a fifth width W5 of the outermost end may have a smaller value than the second width W2. For another example, the slit insulating layer 6 may have a shape in which the width of the end extends but the width thereof may decrease as being separated from the outermost end. In addition, the fifth width W5 may have substantially the same value as the third width W3 of the main pattern 6A or may have different values.

Figure 18G:
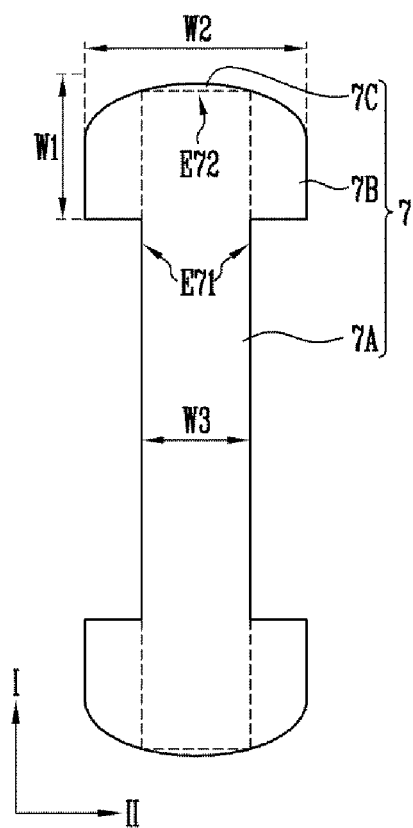

Referring to FIG. 18G, a slit insulating layer 7 includes a main pattern 7A, first protruding patterns 7B, and second protruding patterns 7C. The first protruding patterns 7B are coupled to abut onto first edges E71 of the main patterns 7A, and the second protruding patterns 7C are coupled to abut onto second edges E72 of the main pattern 7A. The protruding patterns 7B have a first width W1 in a first direction I, the main pattern 7A has a third width W3 of a second direction II, and the ends of the slit insulating layer 7 have a second width W2 that is the longest in the second direction II. For example, the second width W2 and the third width W3 may satisfy a condition [W3<W2≤2W3], In addition, the first width W1 and the third width W3 may satisfy a condition [0.5*W3≤W1], and the first width W1 and the third width W3 may have substantially the same value or the first width W1 may have a larger value than the third width W3.

In addition, the first and second protruding patterns 7B and 7C may include at least one curved edge. For example, the first protruding patterns 7B may include both the curved edge and a straight line edge, and the second protruding patterns 7C may include only the curved edge. In this case, the slit insulating layer 7 may become to have the curved edges at the outermost ends.

On the other hand, FIGS. 8A to 18G may be cross-sectional views at a prescribed level of the slit insulating layer, for example, cross-sectional shapes of an upper surface. According to an embodiment, since element insulating layers have different cross-sectional shapes according to a level, a lower surface of the slit insulating layer may be in the form of a line with a uniform width.

Figure 19:
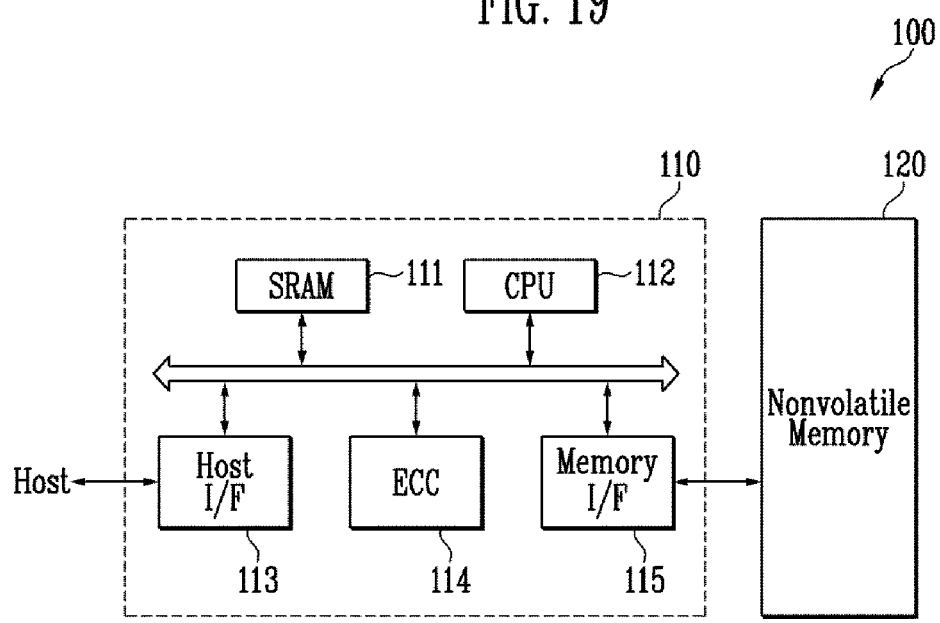
FIG. 19 is a view illustrating the configuration of a memory system according to an embodiment.

FIG. 19 is a view illustrating the configuration of a memory system according to an embodiment.

As illustrated in FIG. 19, a memory system 100 according to an embodiment includes a non-volatile memory device 120 and a memory controller 110.

The non-volatile memory device 120 may have a structure in accordance with the layout as described above. In addition, the non-volatile memory device 120 may be a multi-chip package including a plurality of flagship memory chips.

The memory controller 110 may be configured to control the non-volatile memory device 120 and may include an SRAM 111, a Central Processing Unit (CPU) 112, a host interface (I/F) 113, an ECC circuit 114 and a memory I/F 115. The SRAM 111 may be used as an operating memory of the CPU 112. The CPU 112 may perform an overall control operation for the data exchange of the memory controller 110. The host I/F 113 may include a data exchange protocol of a host that may be coupled to the memory system 100. Furthermore, the ECC circuit 114 may detect and correct errors included in data read out from the non-volatile memory device 120. The memory I/F 115 may interface the memory controller 110 with the non-volatile memory device 120. The memory controller 110 may further include RCM for storing code data for an interface with the host (i.e., Host).

The memory system 100 constructed as above may be a memory card or a Solid State Disk (SSD) in which the non-volatile memory device 120 and the controller 110 may be combined. For example, if the memory system 100 is an SSD, the memory controller 110 may communicate with the outside (e.g., a host) through one of various interface protocols, such as USB, MMC, PCI-E, SATA, PATA, SCSI, ESDI, and IDE, etc.

Figure 20:
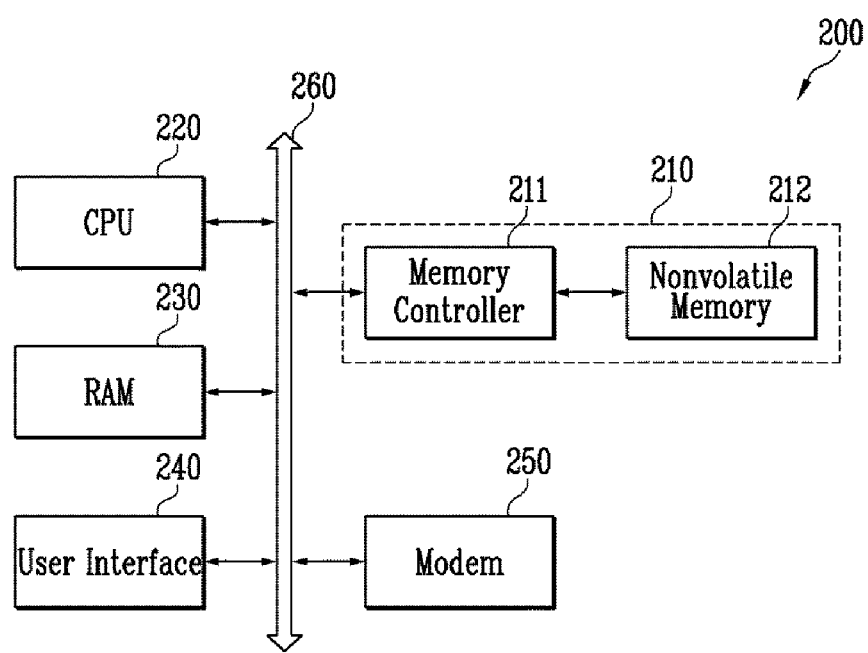
FIG. 20 is a view illustrating the configuration of a computing system according to an embodiment.

FIG. 20 is a view illustrating the configuration of a computing system according to an embodiment.

As illustrated in FIG. 20, the computing system 200 may include a CPU 220, RAM 230, a user interface 240, a modem 250, and a memory system 210 that may be electrically coupled to a system bus 260. If the computing system 200 is a mobile device, the computing system 200 may further include a battery for supplying an operating voltage to the computing system 200. The computing system 200 may further include application chipsets, a Camera Image Processor (CIS), mobile DRAM, and so on.

The memory system 210 may include a non-volatile memory device 212 and a memory controller 211 as described above in connection with FIG. 19.

The present invention provides a three-dimensional semiconductor device that does not have a pipe transistor. In addition, since a memory surface on bottom surfaces of channel holes are not etched, processes of manufacturing a semiconductor device may become easier, and deterioration of memory cell characteristics caused by damage to the memory layer may be prevented.

What is claimed is:

1. A semiconductor device comprising:
a stack comprising conductive layers and insulating layers that are alternately stacked; and
a slit insulating layer passing through the stack in a stacking direction, an upper surface of the slit insulating layer comprising a first main pattern having a first edge and a second edge extending in a first direction, a first protruding pattern protruding from the first edge at a one end of the first main pattern in a second direction crossing the first direction, a second protruding pattern protruding from the second edge at the one end of the first main pattern in the second direction, a third protruding pattern protruding from the first edge at the other end of the first main pattern in the second direction, and a fourth protruding pattern protruding from the second edge at the other end of the first main pattern in the second direction,
wherein a cross-sectional area of the slit insulating layer decreases toward the lower surface thereof, and the cross-sectional area of the slit insulating layer decreases at a greater rate in the end thereof than in the center thereof.

2. The semiconductor device according to claim 1, wherein at least one of the first to fourth protruding patterns has a polygonal cross section.

3. The semiconductor device according to claim 1, wherein at least one of the first to fourth protruding patterns has a circular or elliptical cross section.

4. The semiconductor device according to claim 1, wherein at least one of the first to fourth protruding patterns comprises a stepped edge.

5. The semiconductor device according to claim 1, wherein at least one of the first to fourth protruding patterns comprises a curved edge and a straight line edge.

6. The semiconductor device according to claim 1, wherein the first main pattern has a first width, an end of the slit insulating layer has a second width greater than the first width, an outermost end of the slit insulating layer has a third width less than the second width and greater than the first width.

7. The semiconductor device according to claim 1, wherein a cross-sectional area of the lower surface of the slit insulating layer is less than that of the upper surface of the slit insulating layer.

8. The semiconductor device according to claim 1, wherein the lower surface of the slit insulating layer does not comprise at least one of the first to fourth protruding patterns.

9. The semiconductor device according to claim 1, wherein the slit insulating layer does not comprise at least one of the first to fourth protruding patterns at a prescribed level or lower.

10. The semiconductor device according to claim 1, wherein the slit insulating layer has a first cross-sectional area at a first level, a second cross-sectional area greater than the first cross-sectional area at a second level that is lower than the first level, and has a third cross-sectional area less than the first and second cross-sectional areas at a third level that is lower than the second level.

11. The semiconductor device according to claim 1, wherein the first main pattern comprises a third edge extending in the second direction, and the slit insulating layer comprises a fifth protruding pattern abutting onto the third edge.

12. The semiconductor device according to claim 11, wherein the fifth protruding pattern has a curved edge.

13. The semiconductor device according to claim 1, wherein the slit insulating layer comprises a second main pattern coupling a pair of first main patterns and extending in the second direction.

14. The semiconductor device according to claim 1, wherein the slit insulating layer comprises a second main pattern extending across the first main pattern and a fifth protruding pattern coupled to an end of the second main pattern, and each of the first to fourth protruding patterns has a width greater than a width of the fifth protruding pattern.

15. The semiconductor device according to claim 1, wherein each of the first to fourth protruding patterns has a first width W1 in a first direction, an end of the slit insulating layer has a second width W2 and the first main pattern has a third width W3 in the second direction, wherein $W2 \leq W3 \leq 4W1$ is satisfied.

16. The semiconductor device according to claim 1, wherein the lower surface of the slit insulating layer has a second main pattern having a width substantially equal to a width of the first main pattern.

17. A semiconductor device comprising:
a source structure;
conductive layers stacked on the source structure;
channel layers passing through the conductive layers and coupled to the source structure; and
a slit insulating layer passing through the conductive layers in a stacking direction, and including an upper surface having a shape in which an end thereof is extended in width,
wherein an area of the lower surface is smaller than that of the upper surface, and
wherein a cross-sectional area of the slit insulating layer decreases toward the lower surface thereof, and the cross-sectional area of the slit insulating layer decreases at a greater rate in the end thereof than in the center thereof.

18. The semiconductor device according to claim 17, wherein the upper surface comprises a first main pattern and a protruding pattern coupled to an end of the main pattern, and the lower surface has a second main pattern having a width substantially equal to a width of the first main pattern.

19. The semiconductor device according to claim 17, wherein the source structure comprises:
a first source layer;
a second source layer located inside the first source layer and coupled to the channel layers; and
a third source layer located inside the second source layer, the third source layer passing through the second source layer and coupled to the first source layer.

* * * * *